United States Patent

Shimane et al.

[11] Patent Number: 6,094,031
[45] Date of Patent: Jul. 25, 2000

[54] BATTERY CONDITION-DETECTING APPARATUS AND BATTERY CONDITION-DETECTING UNIT USING AN OPTICAL SIGNAL

[75] Inventors: Iwao Shimane; Satoru Adachi, both of Utsunomiya, Japan

[73] Assignee: Honda Giken Kogyo Kabushiki Kaisha, Tokyo, Japan

[21] Appl. No.: 09/320,851

[22] Filed: May 26, 1999

[30] Foreign Application Priority Data

Jun. 8, 1998 [JP] Japan .................................. 10-159750

[51] Int. Cl.⁷ .................................................. H01M 10/46
[52] U.S. Cl. ............................ 320/118; 320/119; 320/132
[58] Field of Search .................................... 320/106, 110, 320/112, 116, 118, 119, 127, 128, 132, 149, DIG. 18, DIG. 19, DIG. 21; 429/90

[56] References Cited

U.S. PATENT DOCUMENTS 4,394,741 7/1983 Lowndes .
5,206,097 4/1993 Burns et al. .................... 320/114 X
5,298,346 3/1994 Gyenes ...................................... 429/90

FOREIGN PATENT DOCUMENTS 8-079978 3/1996 Japan .

*Primary Examiner*—Edward H. Tso
*Attorney, Agent, or Firm*—Arent Fox Kintner Plotkin & Kahn, PLLC

[57] ABSTRACT

The battery condition such as the voltage of individual batteries for constructing a battery set is intended to be measured by using a simple system. Further, it is also intended to save the electric power consumption. For this purpose, a battery condition-detecting unit is arranged closely with respect to each of the individual batteries for constructing the battery set. Information is transmitted by using an optical signal between the respective battery condition-detecting units and a single transmitting/receiving unit connected to a managing ECU. The battery condition-detecting unit is started up (woken up) on the basis of a request for the detection of the battery condition made by the managing ECU, and it detects the battery condition of the corresponding individual battery. When the detected battery condition is sent to the managing ECU by means of the serial communication with the optical signal, the battery condition-detecting unit is allowed to be in a start-up-waiting state (sleep state).

13 Claims, 18 Drawing Sheets

FIG. 5
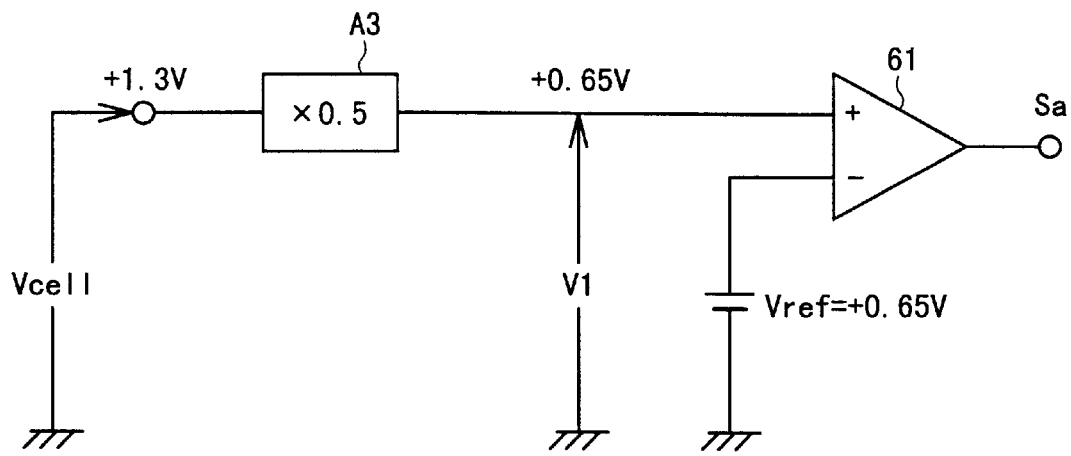
DURING VOLTAGE DETECTION
(ON SIDE OF OVERCHARGE DETECTION)
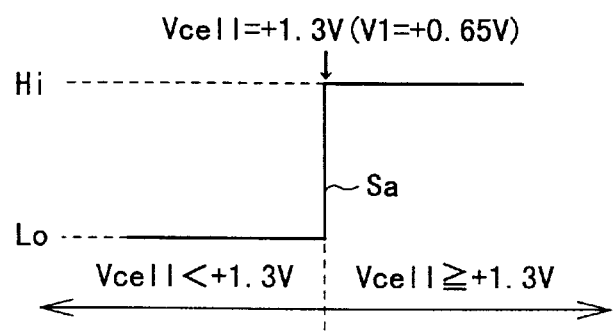

FIG. 7
DURING SELF-DIAGNOSIS
(ON SIDE OF OVERCHARGE DETECTION)
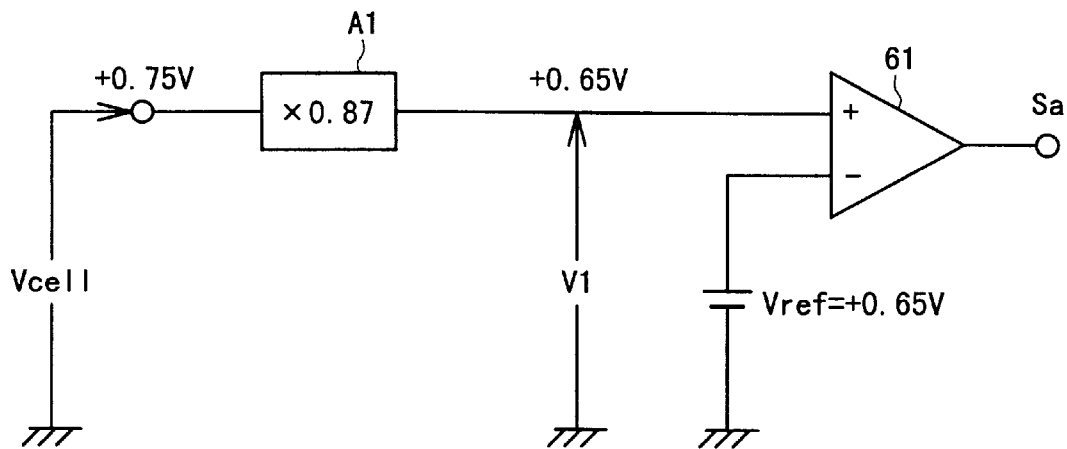
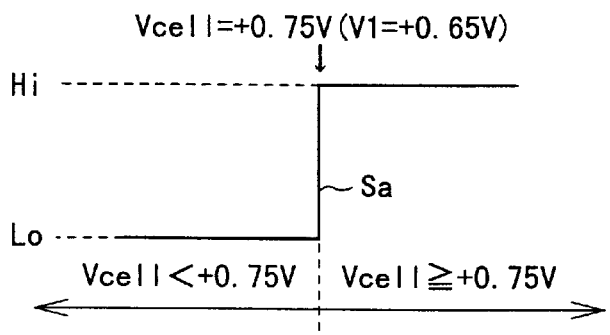

FIG. 8
DURING SELF-DIAGNOSIS
(ON SIDE OF OVERDISCHARGE DETECTION)
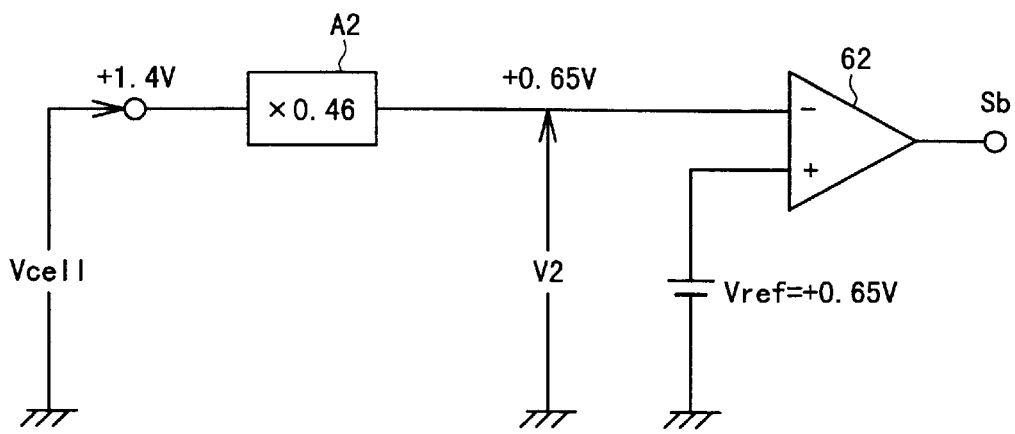
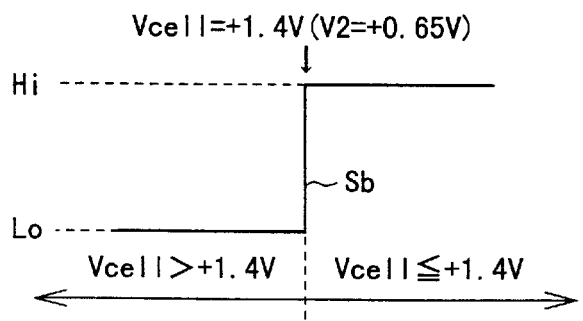

FIG. 11 DURING SELF-DIAGNOSIS

DURING VOLTAGE DETECTION

BATTERY CONDITION-DETECTING APPARATUS AND BATTERY CONDITION-DETECTING UNIT USING AN OPTICAL SIGNAL

BACKGROUND OF THE INVENTION

1. Field of the Invention

The present invention relates to a battery condition-detecting apparatus and a battery condition-detecting unit for detecting the battery condition of a battery set which comprises individual batteries connected in series. In particular, the present invention relates to a battery condition-detecting apparatus and a battery condition-detecting unit preferably used for a battery set which is carried, for example, on an electric vehicle or a hybrid vehicle.

2. Description of the Related Art

An electric vehicle is provided with a motor as a running driving source, and a hybrid vehicle is provided with a motor and an engine as running driving sources. In such vehicles, a battery is carried and used as a power source for the motor.

In such a case, the battery practically comprises a plurality of individual batteries each having about 1 to 12 V. The individual batteries are connected in series so as to provide an appropriate voltage to drive the motor. The individual batteries are utilized in a form of battery set which is designed to be capable of generating a high voltage appropriate to drive the motor.

The battery is highly temperature-dependent. Therefore, when the battery charge or discharge is controlled, it is necessary to detect and control the temperature of the battery, in addition to the detection of the voltage of the battery and the inflow or outflow current with respect to the battery.

The voltage and the temperature of the battery have been hitherto detected, for example, as follows. That is, the high voltage as the terminal voltage is detected (measured) in the state of battery set, and the temperature is detected in the state of battery set.

However, if any of the individual batteries for constructing the battery set has any trouble during the process for detecting the terminal voltage and the temperature in the state of battery set as described above, a problem arises in that it is difficult and time-consuming to specify the troubled individual battery.

In order to solve this problem, the following system may be conceived. That is, detection lines are drawn from points of serial connection of the respective individual batteries which constitute the battery set. The respective detection lines are switched by using a relay to lead them to ECU (electronic control unit) so that the battery voltage is detected.

However, when such a system is adopted, it is necessary to use one which is resistant to high voltage, as the relay for switching the detection lines. Therefore, a problem arises in that the size of the relay is large and the cost is expensive as well.

Further, it is also necessary to use a large number of the detection lines to serves as the lines to draw the voltage from the battery set. Furthermore, each of the detection lines is a thick electric wire which is resistant to high voltage. Therefore, another problem arises in that the harness (wiring arrangement bundle) becomes fat, and it is difficult to practically provide such a harness on a vehicle or the like.

A technique for detecting the voltage of each of the individual batteries for constructing the battery set is exemplified by one disclosed in U.S. Pat. No. 4,394,741. However, this patent document describes nothing about any technique relevant to the problems described above.

SUMMARY OF THE INVENTION

The present invention has been made taking such problems into consideration, an object of which is provide a battery condition-detecting apparatus based on a simple system which makes it possible to reduce the cost and realize a slim harness.

Another object of the present invention is to provide a battery condition-detecting apparatus which makes it possible to exclude any external inhibiting factor such as external light and/or dust when the battery condition is transmitted and received.

Still another object of the present invention is to proved a battery condition-detecting unit based on a simple system which makes it possible to reduce the cost, exclude almost all harnesses, and realize low electric power consumption.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 5 shows a circuit diagram used to explain the relationship between a resistance type potential divider circuit and a comparator disposed on the overcharge detection side upon the voltage detection;

FIG. 7 shows a circuit diagram used to explain the relationship between the resistance type potential divider circuit and the comparator disposed on the overcharge detection side upon the self-diagnosis;

FIG. 8 shows a circuit diagram used to explain the relationship between the resistance type potential divider circuit and the comparator disposed on the overdischarge detection side upon the self-diagnosis;

DESCRIPTION OF THE PREFERRED EMBODIMENTS

An embodiment of the present invention will be explained below with reference to the drawings.

Figure 1:
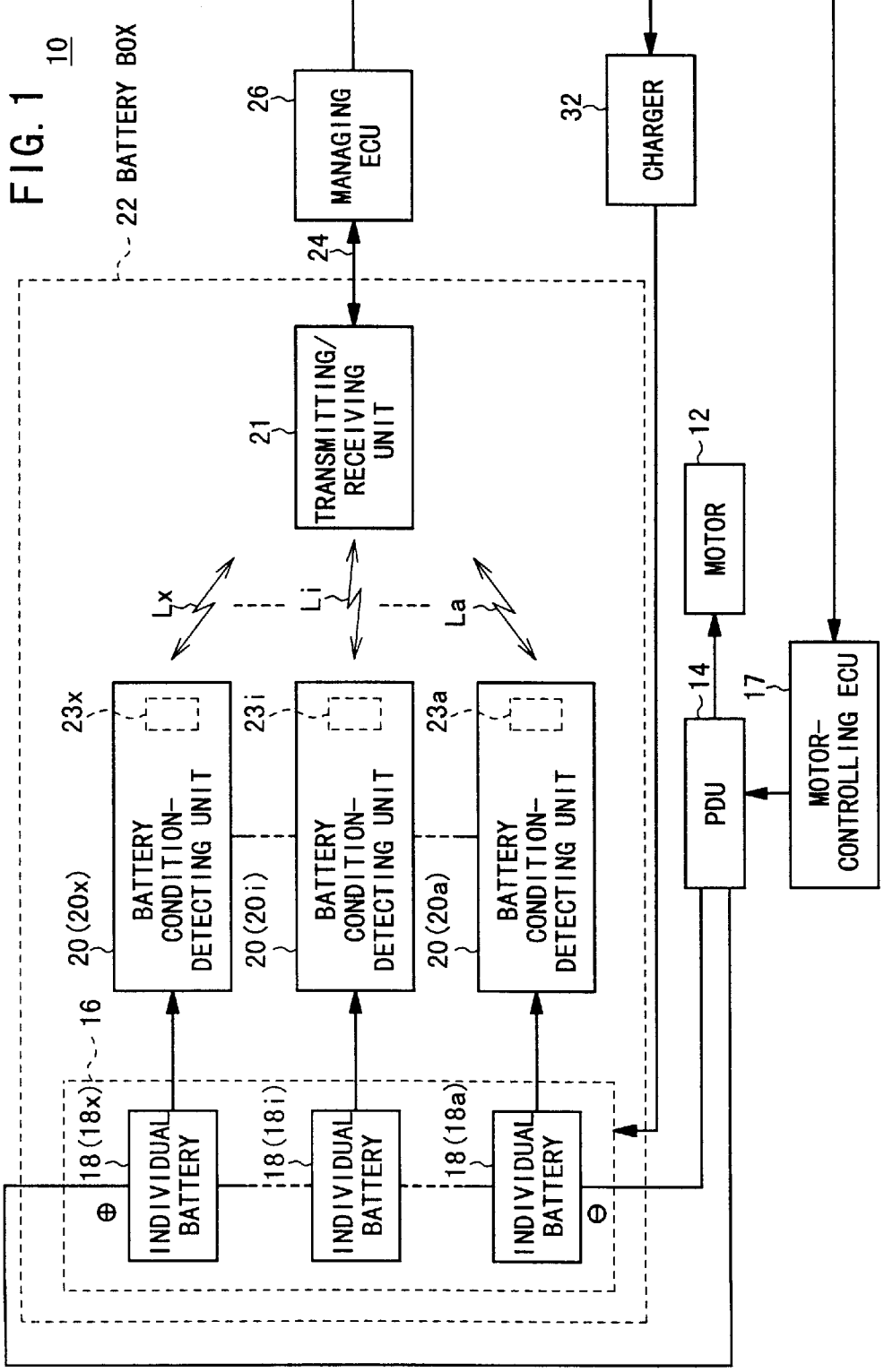
FIG. 1 shows a block diagram illustrating a schematic arrangement of an electric vehicle to which an embodiment of the present invention is applied.

FIG. 1 shows a schematic arrangement of an electric vehicle 10 such as an electric automobile to which the embodiment of the present invention is applied.

The electric vehicle 10 includes a motor 12 as a running driving source. The motor 12 is connected, on the output side, to the wheel (not shown) via unillustrated gears, and it is connected, on the input side, a power drive unit (PDU) 14 including an inverter.

A high voltage, which is generated between both terminals of a battery set 16 as a power source, is supplied to the power source input side of PDU 14. The output side of a motor-controlling ECU (electronic control unit) 17 is connected to the control input side of PDU 14.

The battery set 16 comprises a plurality of individual batteries 18 each of which is an independently exchangeable unit and which are electrically connected to one another in series. In this embodiment, the number of the individual batteries 18 is twenty-four. That is, there are provided the individual batteries 18a, 18b, ... 18x as described later on. Those adoptable as the type of the individual battery 18 include, for example, lead batteries, nickel-hydrogen batteries, and lithium batteries.

A battery condition-detecting unit 20 is connected to each of at least one or more individual batteries 18 which constitute the battery set 16, for detecting the battery condition of each of the at least one or more individual batteries 18, for example, the voltage and the temperature thereof.

This embodiment is arranged such that the battery condition-detecting unit 20 (20a to 20x) is connected one-to-one corresponding to each of the individual batteries 18 (18a to 18x). However, another arrangement may be available. That is, one battery condition-detecting unit 20 is connected to a plurality of individual batteries 18, for example, two individual batteries 18, 18.

The respective battery condition-detecting units 20a to 20x are arranged to transmit and receive the information signal such as those for the battery condition, by using an optical signal with respect to a transmitting/receiving unit 21 arranged at a separated position. In this embodiment, the infrared light system, which is wireless and which is based on the use of the infrared ray, is adopted for the optical signal. Therefore, the battery condition, which is detected by each of the battery condition-detecting units 20a to 20x, is transmitted through the space to the transmitting/receiving unit 21 by the aid of each of the optical signals La to Lx from each of transmitting/receiving sections 23a to 23x included in the respective battery condition-detecting units 20a to 20x. The arrangement based on the use of the optical signal makes it possible to isolate the side of the transmitting/receiving unit 21 from the side of the battery condition-detecting units 20 including the individual battery 18.

As described in detail later on, the battery set 16, all of the battery condition-detecting units 20, and the transmitting/receiving unit 21 are accommodated in a battery box 22 as a battery condition-detecting apparatus. The system is arranged such that the battery is also exchangeable on the basis of the unit of the battery box 22.

The transmitting/receiving unit 21, which functions as an input/output interface for the battery box 22, is connected via a communication line 24 to a managing ECU 26.

Those connected to the managing ECU 26 include a charger 32 carried on the vehicle with unillustrated ECU contained therein for controlling the charging process for the battery set 16, and the motor-controlling ECU 17 described above. The charging operation is executed for the battery set 16 under the control of the charger 32 while being controlled by the managing ECU 26.

As well-known in the art, each of ECU's described above comprises an input interface having a digital input buffer such as an A/D converter or a level converter for converting the analog signal to the digital signal, a computer having, for example, CPU and a memory for performing, for example, the storage and the processing for the digital signal supplied from the input interface, and an output interface having, for example, a digital output buffer and a driving circuit. ECU further includes a timer (electronic timer) as a time-measuring means.

Figure 2:
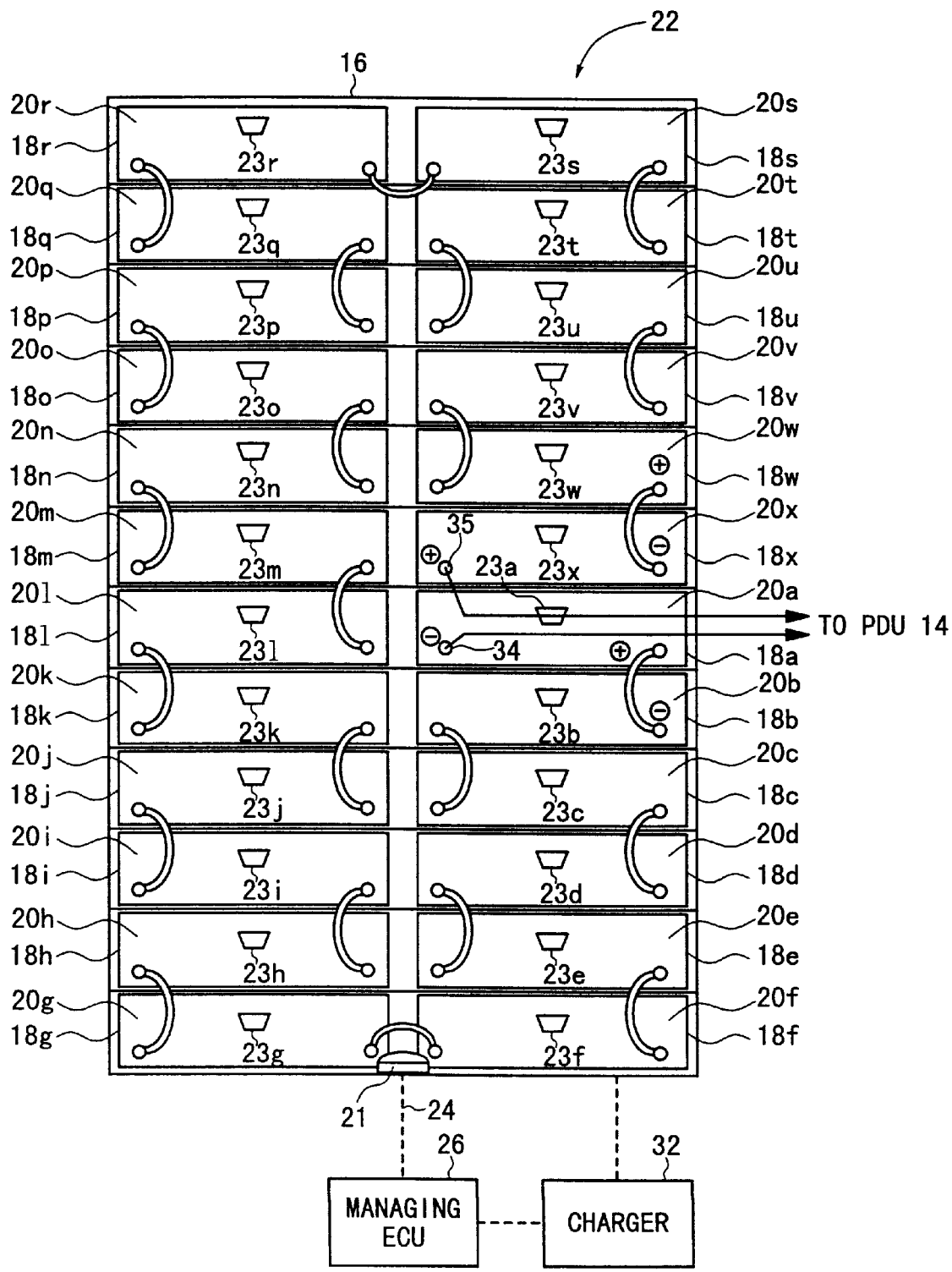
FIG. 2 shows a schematic front view illustrating a detailed arrangement of a battery box of the embodiment shown in FIG. 1.

FIG. 2 shows a front view illustrating the arrangement of the provision of the battery box 22 carried on the electric vehicle 10. As understood from FIG. 2, the battery set 16 comprises the twenty-four individual batteries 18a to 18x each having a nominal voltage of 12V connected in series in this embodiment. Specifically, a positive terminal of the individual battery 18a disposed at the lowest voltage side is connected via a wiring line to a negative terminal of the individual battery 18b. Similarly, the serial connection is made for the followings up to the connection between a positive terminal of the individual battery 18w and a negative terminal of the individual battery 18x disposed on the highest voltage side. Therefore, the negative terminal 34 of the individual battery 18a of the battery set 16 is a ground terminal, and the positive terminal 35 of the individual battery 18x is the high voltage terminal of a nominal voltage of +288 V (12 V×24). The voltage is drawn from the battery box 22 via the high voltage line which is connected to the input side of the inverter which constitutes PDU 14 as shown in FIG. 1. The high voltage lines drawn from the battery box 22 are only the two electric lines.

Practically, as shown in FIG. 2, the serial wiring connection (the connection between the positive terminal of 18a and the negative terminal of 18b, the connection between the positive terminal of 18b and the negative terminal of 18c, ... the connection between the positive terminal of 18w and the negative terminal of 18x) is made between the mutually adjacent individual batteries 18a to 18x in the state in which the individual batteries 18a to 18x are accommodated in the battery box 22.

Each of the battery condition-detecting units 20a to 20x (see FIG. 1 as well) is connected between the positive and negative terminals of each of the individual batteries 18a to 18x corresponding to the individual batteries 18a to 18x accommodated in the battery box 22 of the embodiment shown in FIG. 2. As shown in FIG. 2, each of the battery condition-detecting units 20a to 20x is carried on an unillustrated flexible printed circuit board attached at the front of each of the individual batteries 18a to 18x.

As explained above with reference to FIG. 1, each of the battery condition-detecting units 20a to 20x includes, as the input/output interface, each of the transmitting/receiving units 23a to 23x corresponding to the respective battery condition-detecting units 20a to 20x.

The transmitting/receiving unit 21, which performs the transmission and reception by using the optical signals La to Lx (see FIG. 1) including the contents of information concerning, for example, the battery condition, is arranged on one end side disposed on a substantially central line in the longitudinal direction as viewed from the front of the battery box 22, with respect to the transmitting/receiving sections 23a to 23x of the respective battery condition-detecting units 20a to 20x.

Figure 3:
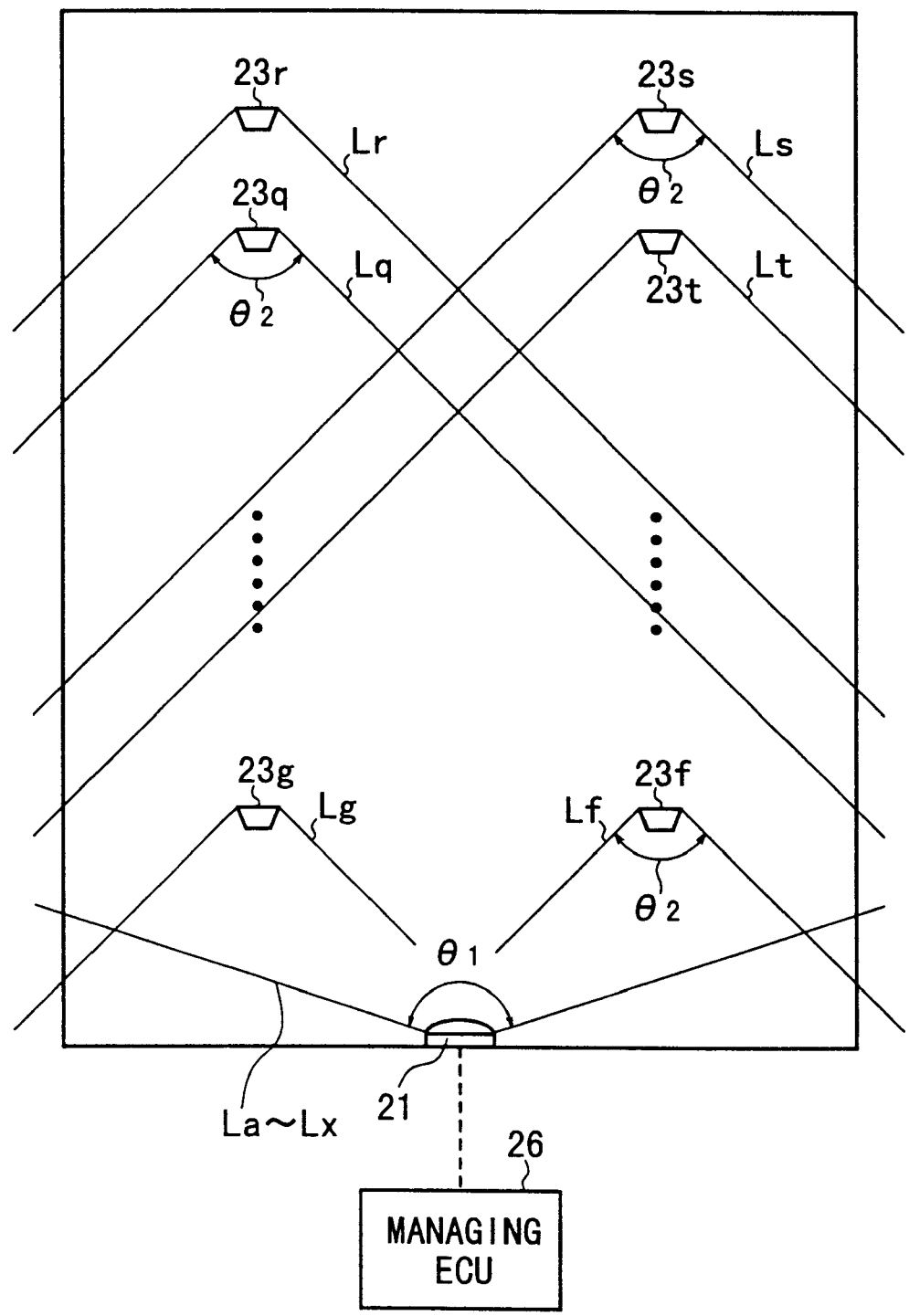
FIG. 3 shows a diagram used to explain a light-projecting range and a light-receiving range for an optical signal which participates in optical signal transmission and reception in the battery box.

As shown in a diagram illustrating the directivity depicted in FIG. 3, the direction angle (the light-projecting range and the light-receiving range) θ1 concerning the directivity of the transmitting/receiving optical signal of the transmitting/receiving unit 21 with its one end connected to the managing ECU 26 is arranged such that at least a part of the direction angle θ1 is opposed to all of the direction angle (the light-projecting range and the light-receiving range) θ2 concerning the directivity of the transmitting/receiving optical signal of each of the transmitting/receiving sections 23a to 23x connected to the respective battery condition-detecting units 20a to 20x. The arrangement as described above makes it possible to perform the transmission and reception with respect to all of the transmitting/receiving sections 23a to 23x by using the single transmitting/receiving unit 21. When the size of the battery box 22 is large, the following arrangement is available in response thereto. That is, a plurality of transmitting/receiving units 21 are provided in order to substantially increase the direction angle θ1 concerning the directivity of the transmitting/receiving optical signal. Output signals of the plurality of transmitting/receiving units 21 are synthesized in a manner of logical sum. The battery condition-detecting apparatus, which comprises the battery condition-detecting units 20a to 20x and the transmitting/receiving unit 21 for the battery condition or the like arranged in the battery box 22 for accommodating the battery set 16 as described above, can be independently handled in an integrated manner, for example, it can be traded or adjusted independently in an integrated manner.

Figure 4:
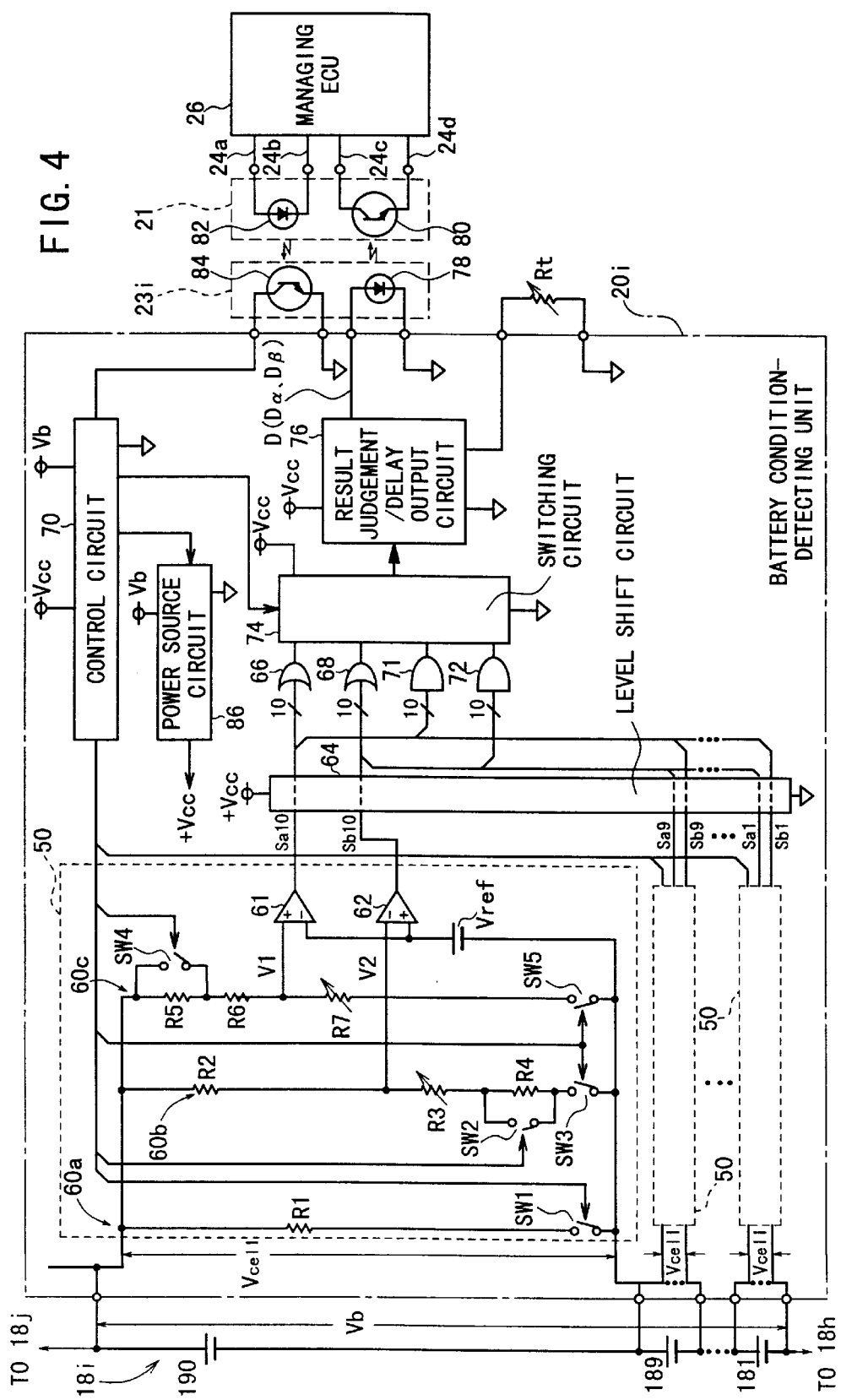
FIG. 4 shows a circuit diagram illustrating detailed arrangement of a battery condition-detecting unit.

FIG. 4 shows a circuit arrangement of the battery condition-detecting apparatus including a detailed arrangement of the battery condition-detecting unit 20i depicted as a representative example. The arrangement of each of the remaining battery condition-detecting units 20a to 20h, 20j to 20x is the same as the arrangement of the battery condition-detecting unit 20i.

As understood from FIG. 4, the individual battery 18i comprises ten battery cells 181 to 190 connected in series. Each of the battery cells 181 to 190 has a nominal voltage value Vcell, i.e., Vcell=+1.2 V. Consequently, the individual battery 18i has its nominal voltage Vb, i.e., Vb=+12 V.

The negative terminal of the battery cell 181 disposed on the lowest voltage side for constructing the individual battery 18i is connected to the positive terminal of the adjacent individual battery 18h. The positive terminal of the battery cell 190 disposed on the highest voltage side for constructing the individual battery 18i is connected to the negative terminal of the adjacent individual battery 18j.

An overdischarge/overcharge voltage-detecting circuit (also referred to as "voltage-detecting circuit") 50 is connected to each of the battery cells 181 to 190 which constitute the individual battery 18i.

The voltage-detecting circuit 50 comprises an individual discharge-equalizing circuit 60a formed by a serial circuit composed of a resistor R1 and a switch SW1 for equalizing the battery voltage by individually discharging each of the battery cells 181 to 190 when the individual battery 18i is a lithium-based battery or capacitor; an overdischarge-detecting circuit 60b formed by resistors R2, R3, R4 and switches SW2, SW3; an overcharge-detecting circuit 60c formed by resistors R5, R6, a variable resistor R7, and switches SW4, SW5; a comparator 61 for detecting the overcharge; and a comparator 62 for detecting the overdischarge. In this arrangement, a reference voltage Vref (the reference voltage is set to be Vref=+0.65 V in this embodiment) is supplied to reference input terminals of the comparators 61, 62 respectively. Detection voltages, which are divided voltages of the battery cell voltage Vcell appearing on the input side of the comparators 61, 62, are represented by symbols V1, V2 respectively.

A switching control signal is supplied from a control circuit 70 including CPU to an ON/OFF control terminal of each of the switches SW1 to SW5. Each of the switches SW1 to SW5 is an electronic switch constructed by MOSFET (metal oxide semiconductor field-effect transistor). All of the switches SW1 to SW5 are open when the battery condition is not detected. The switches SW3, SW5 function as discharge-preventive switches for the purpose of power saving. The switches SW2, SW4 are constructed to be ON respectively only upon the self-diagnosis executed prior to the detection of the battery condition when the battery condition is detected.

Hi/Lo binary level output signals Sa1 to Sa10, Sb1 to Sb10 of the comparators 61, 62, which are output signals of the voltage-detecting circuits 50, are converted into level-shifted binary level output signals (the same symbols Sa1 to Sa10, Sb1 to Sb10 are used for their symbols) by the aid of a level shift circuit 64.

Although the illustration is omitted from FIG. 4 in order to avoid any complexity, the voltage on the positive side of the battery cell 190 is supplied as the positive power source for the comparators 61, 62 for the battery cell 190 via an unillustrated switch, and the voltage on the negative side of the battery cell 190 is supplied as the ground for the comparators 61, 62. The unillustrated switch is closed by the aid of the control circuit 70 during the detection of the battery condition in the same manner as the switches SW2, SW4. The reference voltage Vref is also generated by the power source circuit supplied with the terminal voltage of the battery cell 190 via the unillustrated switch described above.

Therefore, the binary levels of the output signals Sa10, Sb10 of the comparators 61, 62 are as follows. That is, the high level is the voltage level on the positive side of the battery cell 190, and the low level is the voltage level on the negative side of the battery cell 190.

The level shift circuit 64 is operated such that the output signals Sa1 (Sb1) to Sa10 (Sb10), which have different binary levels respectively, are level-shifted to binary signals in which the high level is +Vcc {+5 V as a voltage on the basis of the ground indicated by a symbol ▽ (the negative side of the battery cell 181 is the ground in the case of the individual battery 18*i*)} and the low level is the ground level indicated by the symbol ▽. In this case, it is significant for the binary signal after the level shift whether the level is the low level or the high level. Therefore, the same symbols as those for the output signals Sa1 to Sa10, Sb1 to Sb10 of the comparators 61, 62 are used. Although not shown, the terminal voltages of the respective battery cells 181 to 190 for constructing the individual battery 18*i* are supplied to the level shift circuit 64 respectively.

The respective signals for detecting the overcharge (which serve as the signals for detecting the self-diagnosis during the self-diagnosis process) Sa1 to Sa10 of the battery cells 181 to 190, which are outputted from the level shift circuit 64, are supplied to a OR circuit 66 and an AND circuit 71. The respective signals for detecting the overdischarge (which serve as the signals for detecting the self-diagnosis during the self-diagnosis process) Sb1 to Sb10 of the battery cells 181 to 190 are supplied to a OR circuit 68 and an AND circuit 72.

Explanation will now be made in relation to the voltage Vcell of the battery cell during the self-diagnosis and during the voltage detection (during the detection of the overcharge and during the detection of the overdischarge) for the detection voltages V1, V2, the divided voltage values of the resistance type potential divider circuits disposed on the input side of the comparators 61, 62, and the levels of the detection signals Sa1 to Sa10, Sb1 to Sb10 as the output signals of the comparators 61, 62.

During the self-diagnosis and during the voltage detection, the switch SW1 is in the OFF state, and the switches SW3, SW5 are simultaneously in the ON state. Thus, the resistance type potential divider circuit is formed with the overdischarge-detecting circuit 60*b* and the overcharge-detecting circuit 60*c*.

In the state in which the switches SW3, SW5 are simultaneously turned ON, at first, the switch SW2 and the switch SW4 are in the ON state during the self-diagnosis. Therefore, the detection voltages V1, V2 are given by the following expressions (1) and (2) respectively.

$$V1 \text{ (during self-diagnosis)} = Vcell \times R7/(R6+R7) = Vcell \times A1 \quad (1)$$

wherein, as for the attenuance A1, there is given A1=R7/(R6+R7).

$$V2 \text{ (during self-diagnosis)} = Vcell \times R3/(R2+R3) = Vcell \times A2 \quad (2)$$

wherein, as for the attenuance A2, there is given A2=R3/(R2+R3).

Secondly, during the voltage detection, the detection voltages V1, V2 are given by the following expressions (3) and (4) respectively.

$$V1 \text{ (during voltage detection} = Vcell \times R7/(R5+R6+R7) = Vcell \times A3 \quad (3)$$

wherein, as for the attenuance A3, there is given A3=R7/(R5+R6+R7).

$$V2 \text{ (during voltage detection)} = Vcell \times (R3+R4)/(R2+R3+R4) = Vcell \times A4 \quad (4)$$

wherein, as for the attenuance A4, there is given A4=(R3+R4)/(R2+R3+R4).

During the voltage detection, if the voltages (battery cell voltages) Vcell (nominal value: 1.2 V) of all of the battery cells 181 to 190 for constructing the individual battery 18*i* are within a range of 0.9 V≦Vcell≦1.3 V, the individual battery 18 (all of the battery cells 181 to 190 for constructing the individual battery 18) is judged to be normal.

When the respective battery cells 181 to 190 are within the normal voltage range, the attenuance A3 is set such that the detection voltage V1 for detecting the overcharge has a value which is smaller than that of the reference voltage Vref, and the output of the comparator 61 is at the low level in the non-inverted state.

In other words, as shown in FIG. 5, the attenuance A3 is set such that the output signal Sa (Sa1 to Sa10) of the comparator 61 for detecting the overcharge is inverted from the low level Lo to the high level Hi when the battery cell voltage Vcell exceeds Vcell=1.3 V, in other words, when the detection voltage V1 exceeds the reference voltage Vref=+0.65 V. In this case, as shown in FIG. 5, the attenuance A3 is set to satisfy A3=0.5. Therefore, when the output signal Sa is at the low level Lo, the battery cell 190 is judged to be in the normal state in relation to the detection of overcharge. When the output signal Sa is at the high level Hi, the battery cell 190 is judged to be in the overcharge state.

Figure 6:
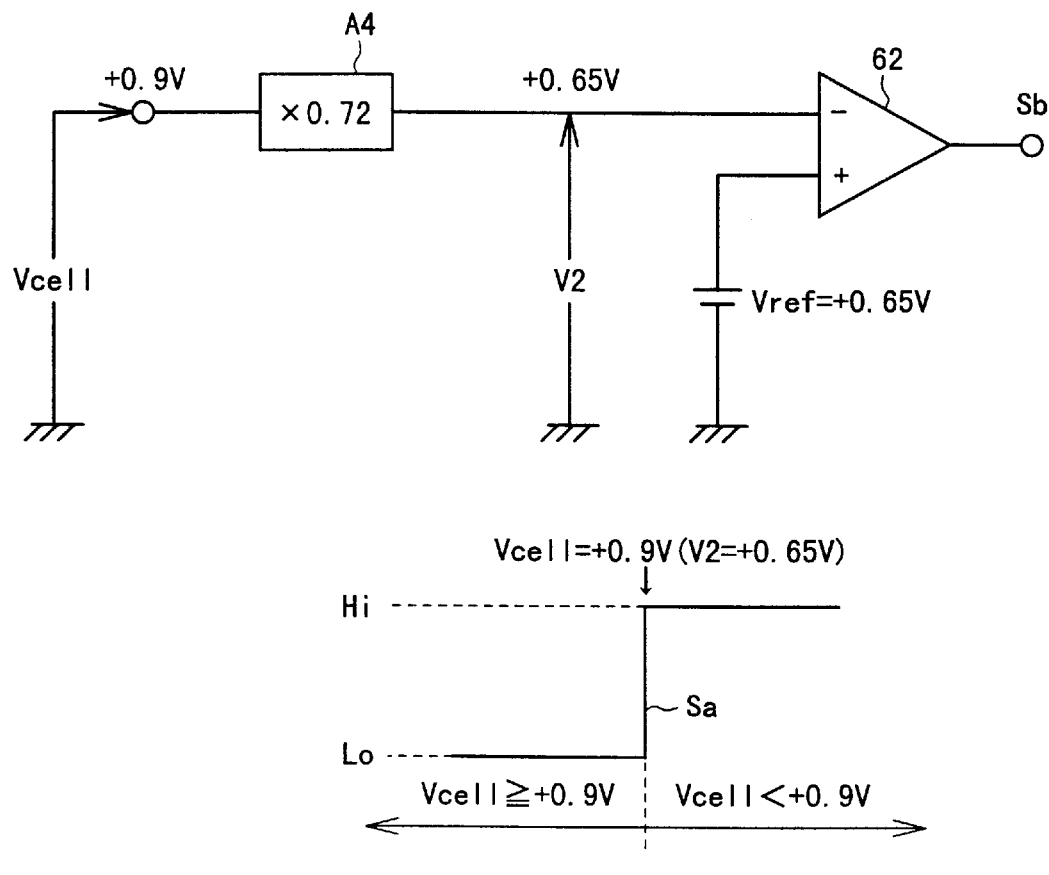
FIG. 6 shows a circuit diagram used to explain the relationship between a resistance type potential divider circuit and a comparator disposed on the overdischarge detection side upon the voltage detection.

Similarly, as shown in FIG. 6, the attenuance A4 is set to satisfy A4=0.72 so that the output signal Sb of the comparator 62 for detecting the overdischarge is judged to be normal, and the low level Lo is outputted when the battery cell voltage Vcell is not less than Vcell=+0.9 V, in other words, the detection voltage V2 is not less than the reference voltage Vref=+0.65 V, while the high level Hi is outputted when the battery cell voltage Vcell is less than 0.9 V. Therefore, when the output signal Sb is at the low level Lo, the battery cell 190 is judged to be in the normal state in relation to the overdischarge. When the output signal Sb is at the high level Hi, the battery cell 190 is judged to be in the overdischarge state.

As a result, when both of the output signal Sa (for example, Sa10) and the output signal Sb (therefore, Sb10) are at the low level Lo, it is judged that the concerning battery cell (battery cell 190 in this case) is in the normal state.

In the self-diagnosis, the state of the battery condition-detecting unit 20 (whether it is normal or abnormal) ranging from the battery cells 181 to 190 to LED (light emitting diode) 78 of the transmitting/receiving unit 23*i* is diagnosed. Therefore, the system is set as follows. That is, the detection voltages V1, V2 are generated to give the condition so that the outputs of the comparators 61, 62 in which the output is at the low level Lo in the normal state are forcibly inverted from the low level Lo to the high level Hi respectively.

Specifically, as shown in FIG. 7, the attenuance A1 is set to satisfy A1=0.87 on the side of the overcharge detection so that the output signal of the comparator 61 is forcibly inverted from the low level Lo to the high level Hi during the self-diagnosis even if the battery cell voltage Vcell imaginarily satisfies Vcell=+0.75 V (the attenuance is set to have a relatively small value so that the detection voltage VI is increased). Under this setting, the battery condition-detecting unit 20 is judged to be in the normal state when the output signal Sa is at the high level Hi, while the battery condition-detecting unit 20 is judged to be out of order (in the abnormal state) when the output signal Sa is at the low level Lo.

Similarly, as shown in FIG. 8, the attenuance A2 is set to satisfy A2=0.46 on the side of the overdischarge detection during the self-diagnosis so that the output signal Sb of the comparator 62 is forcibly inverted from the low level Lo to the high level Hi even if the battery cell voltage Vcell imaginarily satisfies Vcell=+1.4 V (the attenuance is set to have a relatively large value so that the voltage V1 is lowered). Under this setting, the battery condition-detecting unit 20 is judged to be in the normal state when the output signal Sb is at the high level Hi, while the battery condition-detecting unit 20 is judged to be out of order (in the abnormal state) when the output signal Sb is at the low level Lo.

It is noted that this embodiment is constructed as follows as described later on. That is, during the self-diagnosis, it is firstly diagnosed whether or not the state of the diagnosing circuit for the battery condition-detecting unit 20 ranging from the battery cells 181 to 190 to LED 78 of the transmitting/receiving section is normal. Subsequently, the diagnosis is also made for the voltage states of the overdischarge and the overcharge for the respective battery cells 181 to 190 as a whole. During the voltage detection, the voltage states of the overdischarge and the overcharge are not detected for the entire battery cells 181 to 190. Instead, the detection is made in further detail as described later on.

With reference to FIG. 4, the output signals Sa1 to Sa10, Sb1 to Sb10 of the comparators 61, 62, which have the binary levels as described above, are inputted via the level shift circuit 64 into OR circuits 66, 68 and AND circuits 71, 72 respectively.

The outputs of the OR circuits 66, 68 and the AND circuits 71, 72, i.e., the outputs to represent the information on the battery condition are supplied via a switching circuit 74 to a result judgement/delay output circuit 76 with which the delay time Tdi, which corresponds to the prescribed transmission time as the value (time) different for each of the battery condition-detecting units 20a to 20x, can be varied and adjusted by the aid of an externally equipped resistor (delay time-adjusting resistor) Rt.

The output of the result judgement/delay output circuit 76 is supplied to the infrared light emitting diode (LED) 78 which constitutes the transmitting/receiving section 23i of the battery condition-detecting unit 20i.

The output of this LED 78, i.e., the output to represent the information on the battery condition is supplied as the infrared optical signal to the managing ECU 26 via communication lines 24c, 24d by the aid of a phototransistor 80 which constitutes the transmitting/receiving unit 21 disposed in the battery box 22.

On the other hand, for example, the command information such as the start-up command from the managing ECU 26 is supplied as an infrared optical signal via communication lines 24a, 24b by the aid of an infrared light emitting diode (LED) 82 which constitutes the transmitting/receiving unit 21, to a phototransistor 84 which constitutes the transmitting/receiving section 23i of the battery condition-detecting unit 20i. The output of the phototransistor 84 is supplied to the control circuit 70 which controls the entire battery condition-detecting unit 20i and which also functions as a prescribed time operation circuit.

The control circuit 70 controls the ON/OFF state of the switches SW1 to SW5 which constitute the respective voltage-detecting circuits 50 of the respective battery cells 181 to 190 described above, and it controls the switching pattern of the switching circuit 74. Further, the control circuit 70 starts and shuts off (tuns ON and OFF) a power source circuit (constant voltage regulator) 86.

When the power source circuit 86 is in the ON state, it generates, from the power source voltage +Vb (the nominal value is Vb=+12 V), the power source voltage +Vcc (Vcc=+5 V) as the power source for the control circuit 70 itself, the power source for the level shift circuit 64, the power source for the logical circuits 66, 68, 71, 72, the power source for the switching circuit 74, and the power source for the judgement result/delay output circuit 76.

Next, the operation of the embodiment described above will be explained in detail with reference to flow charts concerning the managing ECU 26, while being classified into the running mode (discharge mode) and the charge mode for the electric vehicle 10 respectively. The managing ECU 26 starts the process for controlling the detection of the battery condition when the user starts (the running operation or the charge operation of) the electric vehicle 10.

Figure 9:
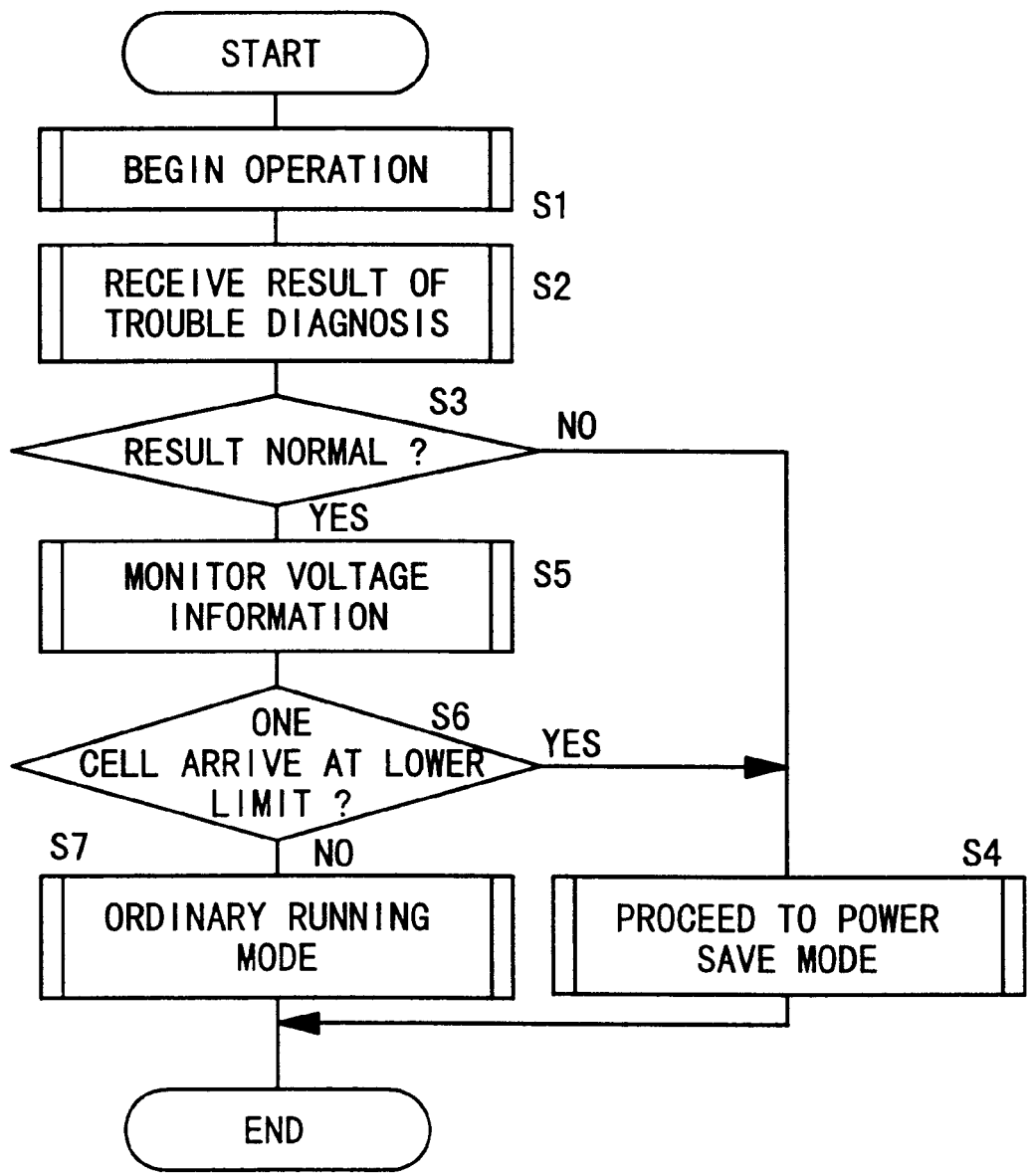
FIG. 9 shows a flow chart used to explain the operation of the managing ECU in the running mode (discharge mode)

FIG. 9 shows an exemplary flow chart concerning the managing ECU 26 in the discharge mode (running mode).

Figure 10:
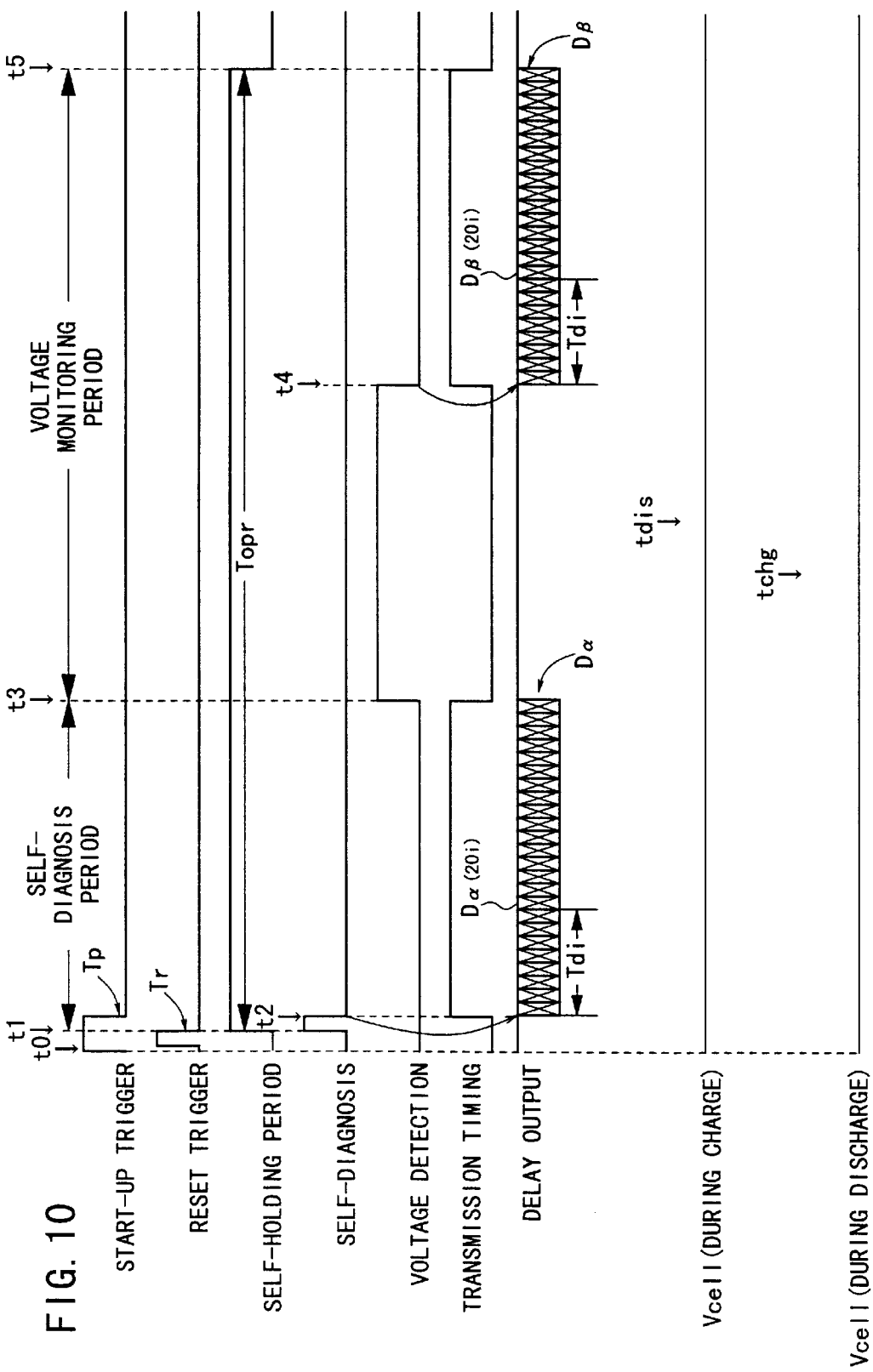
FIG. 10 shows a flow chart used to explain the operation of the battery condition-detecting unit in the running mode and the charge mode.

FIG. 10 shows an exemplary timing chart used to explain the control operation of the control circuit 70 in the discharge mode (running mode) and the charge mode.

In the running mode, the managing ECU 26 firstly generates, at a point of time to, the start-up trigger (pulse) Tp (see FIG. 10) as the start-up signal for emitting light for a certain period of time from LED 82 which constitutes the transmitting/receiving unit 21, via the communication lines 24a, 24b (step S1).

The start-up trigger Tp as the light emitting signal is received by the respective phototransistors 84 of the transmitting/receiving sections 23a to 23x of all of the battery condition-detecting units 20a to 20x, and it is introduced into the control units 70 for the respective battery condition-detecting units 20a to 20x.

When the start-up trigger Tp is introduced, the start-up (wake-up) circuit in each of the control circuits 70 generates the reset trigger Tr (see FIG. 10) to operate the power source circuit 86 so that the power source voltage +Vcc is generated, and the voltage is supplied to the respective components described above. The supply of the power source voltage +Vcc allows the control circuit 70 to perform the so-called self-holding until a point of time t1 in accordance with the so-called power-on reset process. Thus, the operation can be continued even when the start-up trigger Tp returns from the high level to the low level. The self-holding period is a prescribed period of time Topr (see the self-holding period in FIG. 10) managed by the timer (time-measuring means) in each of the control circuits 70. After the passage of the prescribed period of time, all of the battery condition-detecting units 20 enter the start-up-waiting state as a sleep state until the arrival of the next start-up trigger Tp. Accordingly, it is possible to save the electric power.

All of the battery condition-detecting units 20a to 20x perform the self-diagnosis (trouble diagnosis) described above during the period between the points of time t1 and t2 from the start of the self-holding (see the pulse waveform of the self-diagnosis in FIG. 10). The self-diagnosis result is successively transmitted during the period between the points of time t2 and t3, from LED 78 of the respective transmitting/receiving sections 23a to 23x which constitute the battery condition-detecting units 20a to 20x, to the phototransistor 80 which constitutes the transmitting/receiving unit 21 in accordance with the timing (prescribed period of transmission time) determined by the result judgement/delay output circuit 76 (see the waveform of the transmission timing in FIG. 10). The self-diagnosis result data Dα {Dα (20a), Dα (20b), . . . Dα (20i), . . . Dα (20x)} is transmitted by means of the serial communication (see the self-diagnosis result data Dα of the delay output in FIG. 10). The period between the points of time t1 and t3 is called "self-diagnosis period".

The timing determined by the result judgement/delay output circuit 76 is previously stored in the managing ECU 26. Therefore, the managing ECU 26 can correctly receive the self-diagnosis result data (received data of the trouble diagnosis result) Dα for the respective battery condition-detecting units 20a to 20x corresponding to the timing (step S2).

The contents of the diagnosis of the self-diagnosis result data Dα and the timing of the result judgement/delay output circuit 76 will be explained more specifically.

Figure 11:
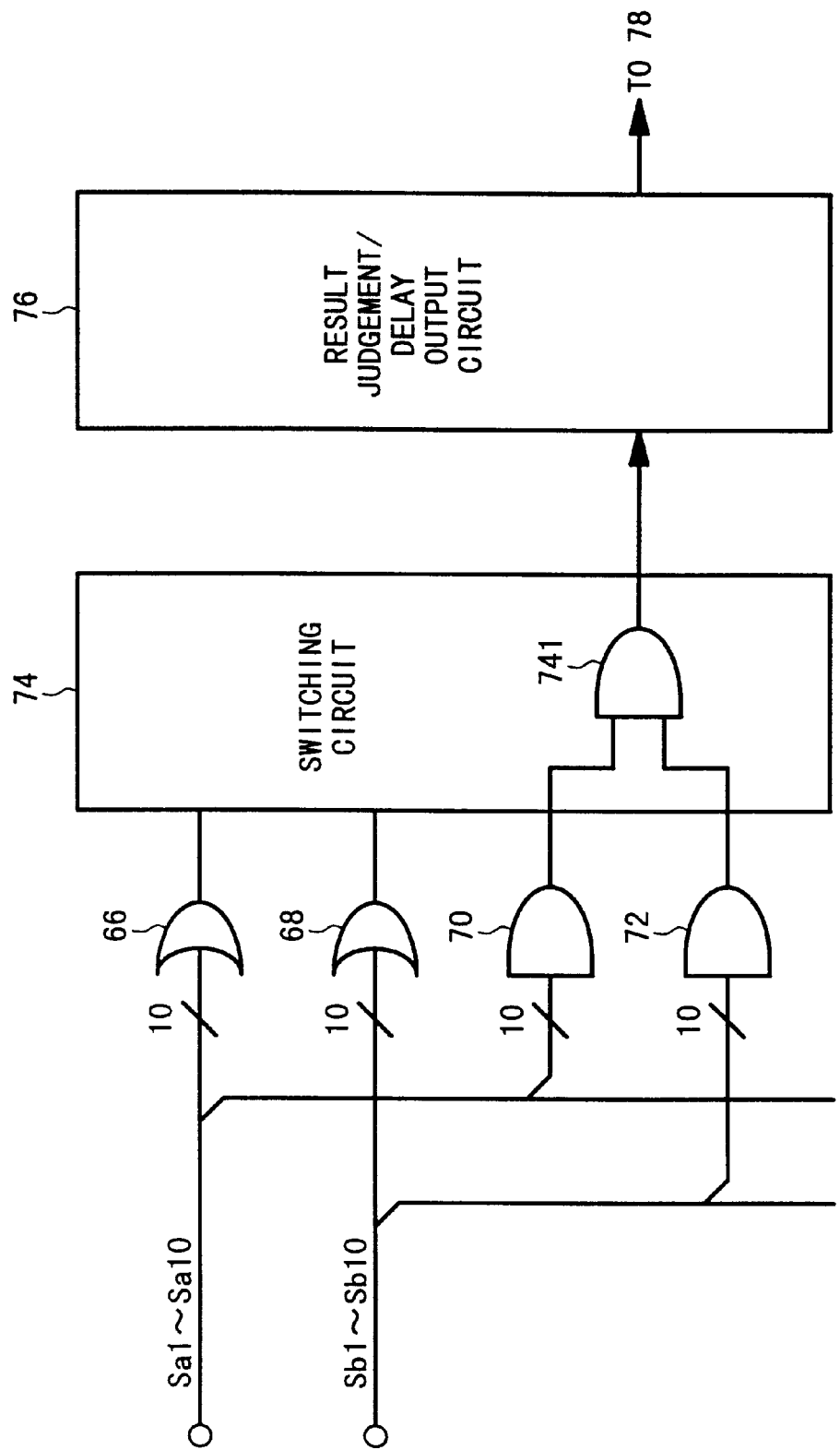
FIG. 11 shows a circuit diagram used to explain the function of, for example, the switching circuit during the self-diagnosis.

As shown in FIG. 11, during the self-diagnosis process, the switching circuit 74 of each of the battery condition-detecting units 20a to 20x is arranged as follows. That is, the outputs of the OR circuits 66, 68 are in the shut off state, and only the outputs of the AND circuits 71, 72 are supplied to the result judgement/delay output circuit 76 via an AND circuit 741 formed in the switching circuit 74. In this state, when the switches SW2 to SW5 are closed (the switch SW1 is in the open state), if all of the comparators 61, 62 for constructing the respective battery condition-detecting units 20a to 20x are inverted from the low level Lo to the high level Hi, then the output of the AND circuit 741 of each of the battery condition-detecting units 20a to 20x is at the high level for the first time, and it is judged that the diagnosis circuit is normal. Subsequently, the switches SW2, SW4 are opened to confirm whether or not the battery cell voltages Vcell of all of the battery cells 181 to 190 of the battery condition-detecting units 20a to 20x are within the range of +0.9 V≦Vcell≦+1.3 V which is the normal range.

Figure 12:
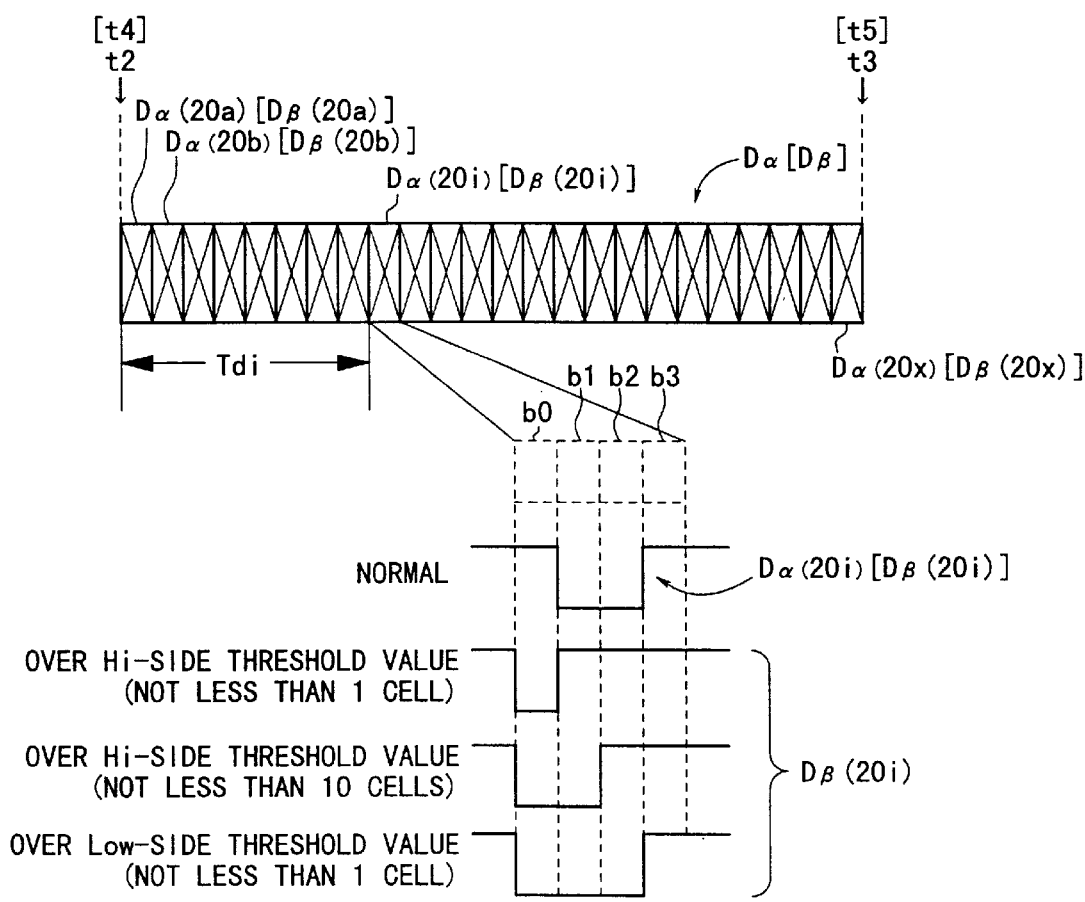
FIG. 12 shows a diagram used to explain the contents of transmission data.

A specified example of the self-diagnosis result data Dα is shown in FIG. 12. The example shown in FIG. 12 also illustrates a specified example of the battery condition detection result data Dβ described later on (the symbol or the like is surrounded by [ ]).

As shown in FIG. 12, for example, the self-diagnosis result data Dα (20i) of the battery condition-detecting unit 20i is transmitted after the delay time Tdi which is the prescribed transmission time for the battery condition-detecting unit 20i. The self-diagnosis result data Dα (20i) is composed of 4-bit data (b0, b1, b2, b3). Allotment is made such that the former two bits (b0, b1) represent the diagnosis result for the circuit, and the latter two bits (b2, b3) represent the judgement result for the exceeding state for all of the battery cells 181 to 190.

The data (b0, b1, b2, b3)=(1, 0, 0, 1) specifically shown in FIG. 12 indicates the state in which the circuit and all of the battery cells 181 to 190 are normal.

The contents of the diagnosis result of the self-diagnosis result data Dα is judged by the managing ECU 26 (step S3). If it is judged that the self-diagnosis result is not normal, the routine proceeds to the so-called power save mode (referred to as "power down mode" as well) to suppress the maximum output when an unillustrated accelerator pedal is pedaled (step S3: NO, step S4). Accordingly, the motor-controlling ECU 17 restricts the output current supplied from the battery set 16 to PDU 14. As a result, the amount of current supplied from PDU 14 to the motor 12 is restricted. The proceeding to the power save mode, or the fact that the self-diagnosis result of the battery is not normal is displayed on an unillustrated alarm display means.

If the judgement results of the self-diagnosis result data Dα {Dα=Dα (20a), Dα (20b), . . . Dα (20i), . . . Dα (20x)} for all of the battery condition-detecting units 20a to 20x are normal, the routine proceeds to the process for monitoring the voltage information including the reception-waiting state for the battery condition detection result data (voltage detection result data) Dβ (step S4).

As shown in FIG. 10, the period between the points of time t3 and t4 during the battery voltage-monitoring period between the points of time t3 and t5 is designated as the voltage detection period. For example, the battery cell voltage Vcell during the discharge of the battery is detected at a detection point of time tdis. The battery condition detection result data Dβ {Dβ=Dβ (20a), Dβ (20b), . . . Dβ (20i), . . . Dβ (20x)}, which is detected by all of the battery condition-detecting units 20a to 20x during the transmission timing period between the points of time t4 and t5, is transmitted to the managing ECU 26 from the respective battery condition-detecting units 20a to 20x via the result judgement/delay output circuit 76 at the predetermined timing described above by the aid of LED 78 for constructing the respective transmitting/receiving sections 23a to 23x.

The switches SW1, SW2, SW4 are in the open state during the voltage detection period between the points of time t3 and t4. Thus, the voltage detection state is given for the battery cell voltage Vcell described above in which the switches SW3, SW5 are in the closed state.

Figure 13:
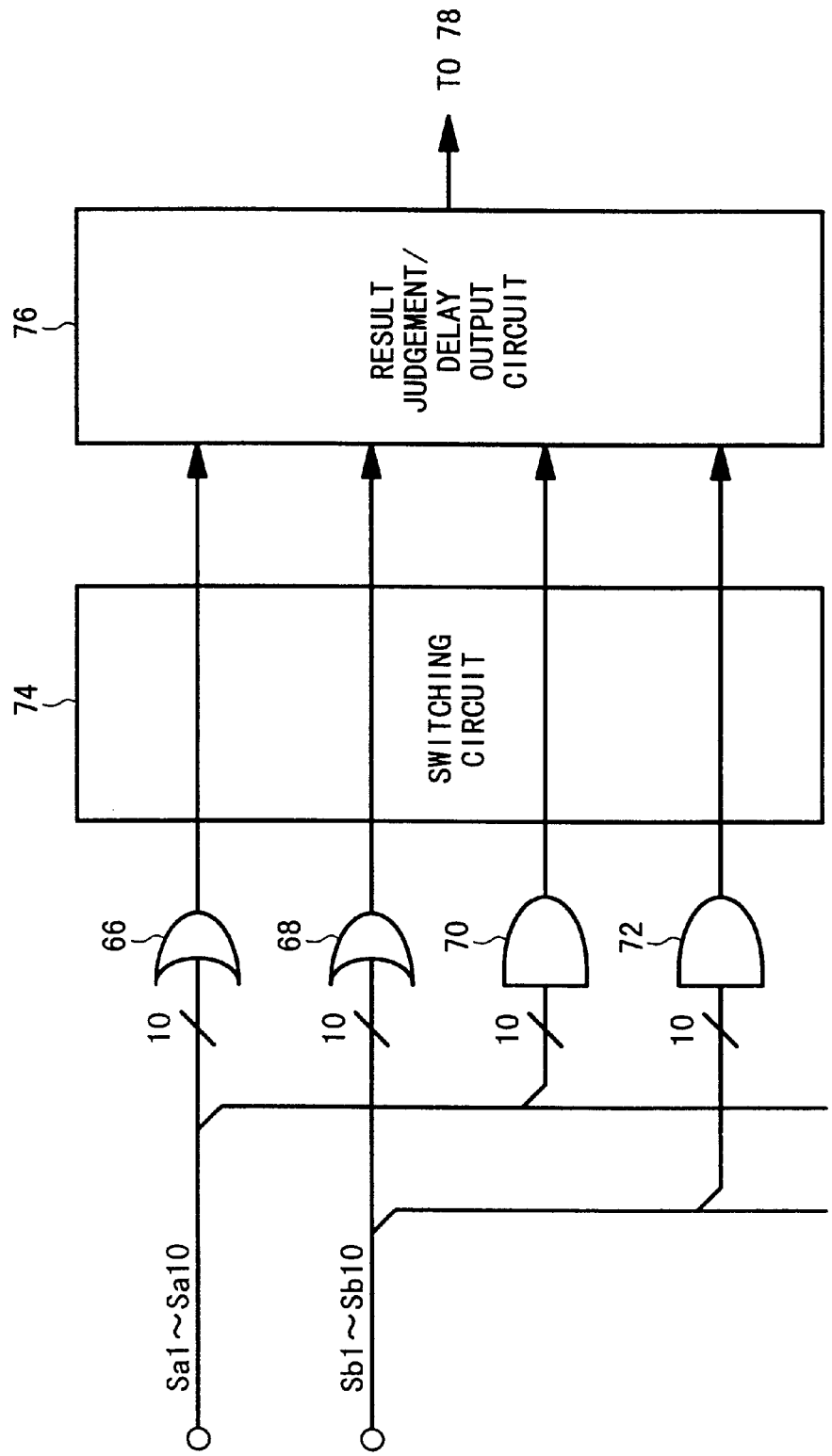
FIG. 13 shows a circuit diagram used to explain the function of, for example, the switching circuit during the voltage detection.

As shown in FIG. 13, during the voltage detection, the switching circuit 74 is switched so that the outputs of the OR circuits 66, 68 and the AND circuits 71, 72 are supplied to the result judgement/delay output circuit 76 as they are.

In this situation, as shown in FIG. 12, the result judgement/delay output circuit 76 outputs (b0, b1, b2, b3)=(1, 0, 0, 1) as the bit data (b0, b1, b2, b3) if all of the battery cells 181 to 190 are normal (0.9 V≦Vcell≦1.3 V). If the number of battery cells 181 to 190 in the overcharge state (Vcell>1.3 V) is not less than 1 and less than 9, the result judgement/delay output circuit 76 outputs (b0, b1, b2, b3)=(0, 1, 1, 1) as the bit data (b0, b1, b2, b3). If the number of battery cells 181 to 190 in the overcharge state (Vcell>1.3 V) is not less than 10, the result judgement/delay output circuit 76 outputs (b0, b1, b2, b3)=(0, 0, 1, 1) as the bit data (b0, b1, b2, b3). If the number of battery cells 181 to 190 in the overdischarge state (Vcell<0.9 V) is not less than 1, the result judgement/delay output circuit 76 outputs (b0, b1, b2, b3)=(0, 0, 0, 1) as the bit data (b0, b1, b2, b3).

In the running mode (discharge mode), the managing ECU 26 judges whether or not the contents of the respective bit data (b0, b1, b2, b3) of the battery condition detection result data Dβ represent the normal state, and whether or not at least one of the battery cells 181 to 190 represents the overdischarge state (in FIG. 12, over low-side threshold value (not less than 1 cell)) (step S6). If at least one of the battery cells 181 to 190 is in the overdischarge state, the routine proceeds to the power save mode (step S4). In the power save mode, the control is made such that the running output is throttled, and thus the battery cells 181 to 190 are prevented from polarity inversion to prolong the service life of the battery cells 181 to 190.

On the contrary, if the contents of all of the bit data (b0, b1, b2, b3) of the battery condition detection result data Dβ represent the normal state, the ordinary running mode is continued (step S7).

On the other hand, the control circuit 70 of the battery condition-detecting units 20a to 20x allows the battery condition-detecting units 20a to 20x to be in the start-up-waiting state at the completion point of time t5 of the voltage monitoring period. Therefore, the power source circuit 86 is allowed to be in the shut off state, and the self-holding is canceled to enter the sleep state (start-up-waiting state). The battery condition-detecting units 20a to 20x, which are allowed to be in the sleep state, are waken up (started up) in accordance with the next start-up trigger from the managing ECU 26.

The operation in the running mode (discharge mode) of the electric vehicle 10 has been explained in the foregoing description.

Figure 14:
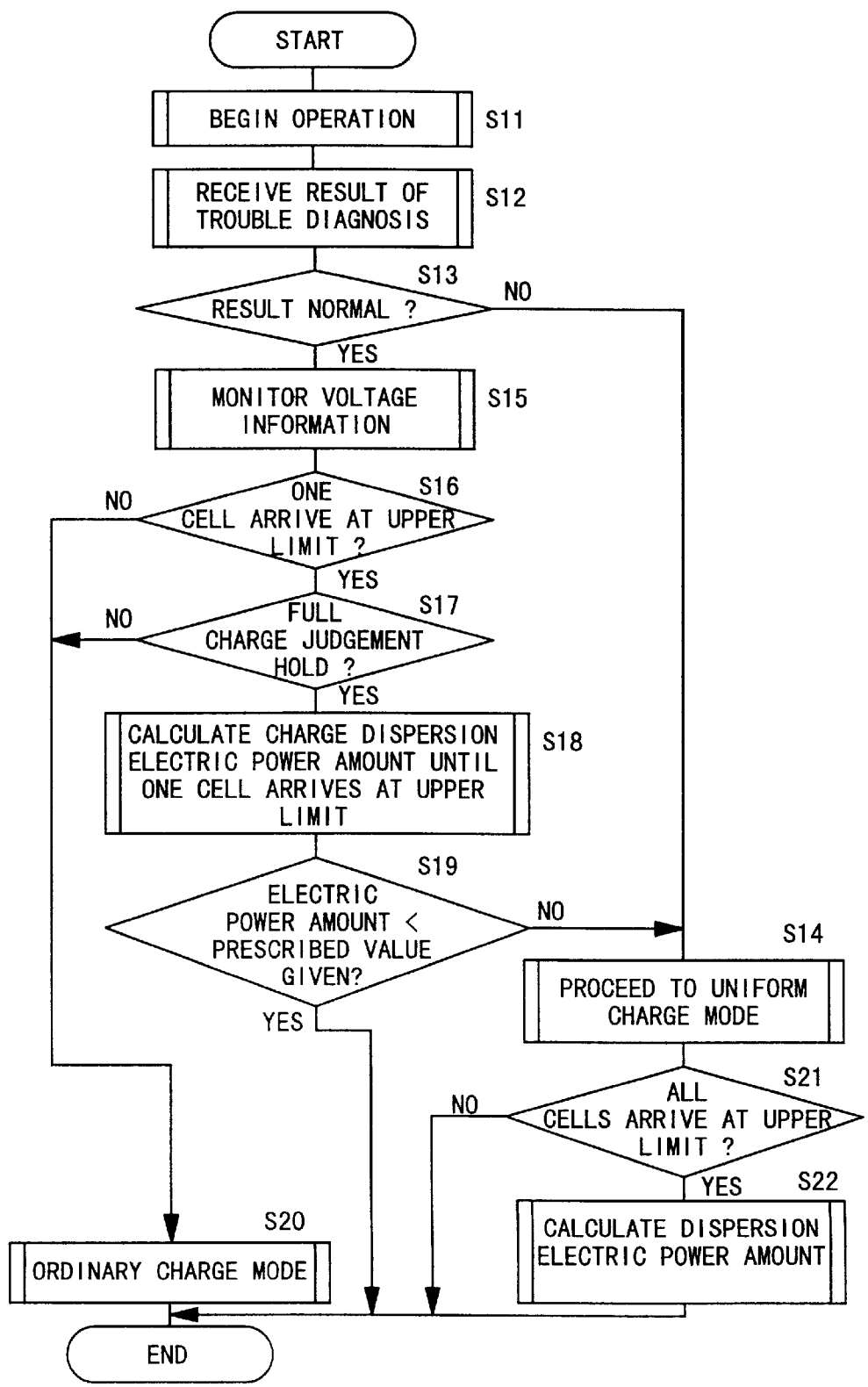
FIG. 14 shows a flow chart used to explain the operation of the managing ECU in the discharge mode.

Next, the operation in the charge mode will be explained with reference to a flow chart relative to the managing ECU 26 in the charge mode shown in FIG. 14 and with reference to the timing chart shown in FIG. 10 as well.

The respective processes performed in the steps S11, S12, S13, and S15 in the charge mode are equivalent to the respective processes performed in the steps S1, S2, S3, and S5 in the running mode described above. Therefore, detailed explanation of these processes will be omitted.

In the charge mode, the motor-controlling ECU 17 is not driven, and the charge control is made for the battery set 16, i.e., the individual batteries 18 by the aid of the charger 32. In this case, as explained in the step S1, the managing ECU 26 generates, at the point of time t0, the start-up trigger Tp which is sent to the control circuit 70 from LED 82 of the transmitting/receiving unit 21 by the aid of all of the phototransistors 84 of the transmitting/receiving sections 23a to 23x which constitute the battery condition-detecting units 20a to 20x. Thus, all of the battery condition-detecting units 20a to 20x are started up (step S11). Accordingly, the control circuit 70 generates the reset trigger Tr to operate the power source circuit 86 so that the self-holding is performed for the prescribed period of time Topr.

Subsequently, all of the battery condition-detecting units 20a to 20x perform the self-diagnosis (trouble diagnosis) described above during the period between the points of time t1 and t2. The self-diagnosis result is successively transmitted as the self-diagnosis result data Dα (Dα (20a), Dα (20b), . . . , Dα (20i), . . . Dα (20x)) to the transmitting/receiving unit 21 at the timing determined by the result judgement/delay output circuit 76 during the period between the points of time t2 and t3. The managing ECU 26 can correctly receive the self-diagnosis result data (trouble diagnosis result reception data) Dα of the respective battery condition-detecting units 20a to 20x corresponding to the timing described above (step S12).

The contents of the diagnosis result of the self-diagnosis result data Dα are judged by the managing ECU 26 (step S13). If it is judged that the result is not normal, the routine proceeds to the uniform charge mode in which the charge is continued while restricting the charge current (step S14).

If all of the judgement results of the self-diagnosis result data Dα are normal {if the bit data (b0, b1, b2, b3) is (b0, b1, b2, b3)=(1, 0, 0, 1)}, the routine proceeds to the process for monitoring the voltage information including the reception-waiting state for the battery condition detection result data (voltage detection result data) Dβ (step S15).

As shown in FIG. 10, the period between the points of time t3 and t4 during the battery voltage-monitoring period between the points of time t3 and t5 is designated as the voltage detection period. For example, the battery cell voltage Vcell during the charge of the battery is detected at a detection point of time tchg. The battery condition detection result data Dβ {Dβ=Dβ (20a), Dβ (20b), . . . Dβ (20i), . . . Dβ (20x)}, which is detected by all of the battery condition-detecting units 20a to 20x during the transmission timing period between the points of time t4 and t5, is transmitted to the managing ECU 26 from the respective battery condition-detecting units 20a to 20x via the result judgement/delay output circuit 76 at the predetermined timing described above by the aid of the respective transmitting/receiving sections 23a to 23x by using the transmitting/receiving unit 21.

As described above, the switches SW1, SW2, SW4 are in the open state during the voltage detection period between the points of time t3 and t4. Thus, the voltage detection state is given for the battery cell voltage Vcell described above in which the switches SW3, SW5 are in the closed state. As shown in FIG. 13, during the voltage detection, the switching circuit 74 is switched so that the outputs of the OR circuits 66, 68 and the AND circuits 71, 72 are supplied to the result judgement/delay output circuit 76 as they are.

In this situation, the result judgement/delay output circuit 76 outputs the bit data (b0, b1, b2, b3) for representing the various contents shown in FIG. 12 respectively on the basis of its own judgement result.

In the charge mode, the managing ECU 26 judges whether or not the content of the bit data (b0, b1, b2, b3) is changed to the bit data (b0, b1, b2, b3)=(0, 1, 1, 1) which represents the fact that the battery cell voltage Vcell of at least one of the battery cells 181 to 190 arrives at the upper limit voltage of Vcell=+1.3 V (step S16). If no change is made, the ordinary charge mode is continued (step S20). In the ordinary charge mode, the constant current charge control or the constant electric power charge control, which is well-known in the art, is effected for the battery set 16 by the aid of the charger 32.

If the judgement in the step S16 holds, namely if at least one battery cell of the battery cells 181 to 190 arrives at the upper limit voltage, the routine proceeds to the full charge judgement control (step S17).

In the full charge judgement process, the judgement is made, for example, depending on whether or not the terminal voltage of the battery set 16 (the serial voltage of the 240 individuals of battery cells in total for constructing the 24 pieces of individual batteries 18) exceeds the predetermined value (step S17).

If the full charge judgement does not hold, the ordinary charge mode is continued (step S20). The charge is performed until the full charge is obtained in which the judgement in the step S17 holds.

If the full charge judgement in the step S17 holds, the dispersion electric power amount (Wd) is calculated from the charge current value (Ichg) and the period of time (Ts) required from the arrival of the first one battery cell at the upper limit voltage in the step S16 to the point of time of the full charge judgement (step S18). The dispersion electric power amount Wd is calculated by Wd=Ts×Ichg.

If the dispersion electric power amount Wd is smaller than a previously determined prescribed value, then it is judged that the charge is normally performed for the battery set 16, and the charge operation is completed (step S19: YES).

On the other hand, if the dispersion electric power amount Wd is larger than the prescribed value (step S19: NO), then it is judged that the dispersion occurs, and the routine proceeds to the uniform charge mode (step S14) to perform the uniform charge to dissolve the dispersion.

In the uniform charge, the charge is performed until the battery cell voltage Vcell of all of the 240 individuals of battery cells 181 to 190 arrives at the upper limit voltage of +1.3 V (step S21). During the uniform charge, the charge is performed with an extremely small current as compared with the current used when the ordinary charge is performed, so that a slight overcharge state is given for almost all of the battery cells 181 to 190. Accordingly, it is possible to dissolve the difference in charge efficiency and the difference in accumulation capacity which would be otherwise caused by the self-discharge of the battery. Thus, it is possible to prolong the service life of the battery.

When the uniform charge is established in which the judgement in the step S21 holds, the dispersion electric power amount is calculated for all of the battery cells 181 to 190 from the charge time and the charge current which are used from the point of time at which the judgement in the step S19 does not hold to the point of time at which all of the battery cells 181 to 190 arrive at the upper limit voltage value. Subsequently, for example, the charge current required when the uniform charge is performed is calculated, and thus the charge mode is completed (step S22).

In the charge mode, the start-up trigger Tp is generated at every constant period of time. However, when the charge mode is completed, the start-up trigger Tp at every constant period of time is not generated. Therefore, all of the switches SW1 to SW5 are in the open state at the point of time t5 of the passage of the voltage monitoring period. Accordingly, no electric power is consumed by the resistors R1 to R7 during the period in which the battery is left to stand. Therefore, it is possible to save the electric power (realize the electric power saving).

In the embodiment described above, the comparators 61, 62 are utilized to detect the upper and lower limit voltages (+1.3 V and +0.9 V) of the battery cells 181 to 190. However, another system may be constructed, in which the judgement is not simply made by detecting whether the voltage is not less than or not more than the predetermined voltage. For example, a voltmeter is arranged in which an operational amplifier is connected to the output side of the resistance type potential divider circuit. The voltmeter is used to detect the battery cell voltage Vcell of the battery cells 181 to 190. An A/D converter is utilized to make conversion into a digital signal, and the digital signal is transmitted to the side of the managing ECU 26 by using the optical signal.

In addition to the detection of the battery cell voltage Vcell, the temperature of the battery may be also detected and transmitted in order to detect the non-uniformity of the battery temperature in relation to the charge and discharge. In order to detect the battery temperature, a temperature-detecting circuit including a temperature-detecting element such as a thermistor may be arranged corresponding to a desired combination including, for example, a unit of one or a plurality of battery cells, a unit of one or a plurality of individual batteries 18, or the entire battery set 16.

Figure 15:
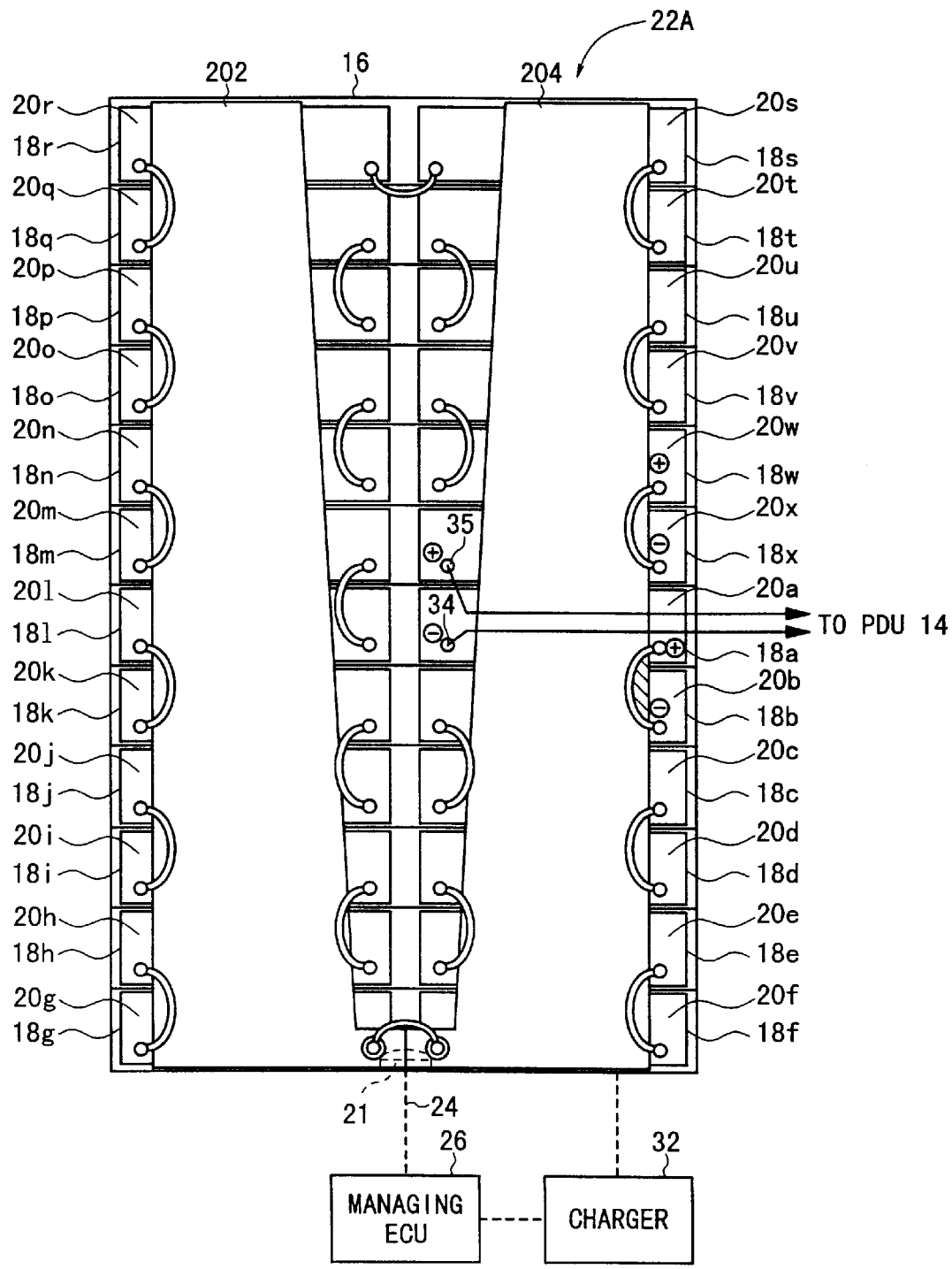
FIG. 15 shows a schematic front view illustrating an arrangement comprising a shield plate arranged for an optical path in the battery box.

FIG. 15 shows a front arrangement of a battery box 22A wherein two shield plates 202, 204, each of which has a substantially trapezoidal configuration and which are disposed at the right and left, are arranged to shield, from any external inhibiting factor such as dust and external light for the optical path, the optical path for the optical signals La to Lx (see also FIG. 1) formed between the transmitting/receiving unit 21 and the transmitting/receiving sections 23 of the battery condition-detecting units 20 arranged in the battery box 22 shown in FIG. 2.

The battery box 22A includes the shield plates 202, 204 which are arranged and fixed between the transmitting/receiving unit 21 and the transmitting/receiving sections 23 (which cannot be seen in FIG. 15 because of the state of being covered with the shield plates 202, 204) of the battery condition-detecting units 20, at positions disposed thereover and separated therefrom by a certain spacing distance. Therefore, it is possible to ensure the good state of the optical path for the optical signals La to Lx between the transmitting/receiving sections 23 and the transmitting/receiving unit 21.

Figure 16:
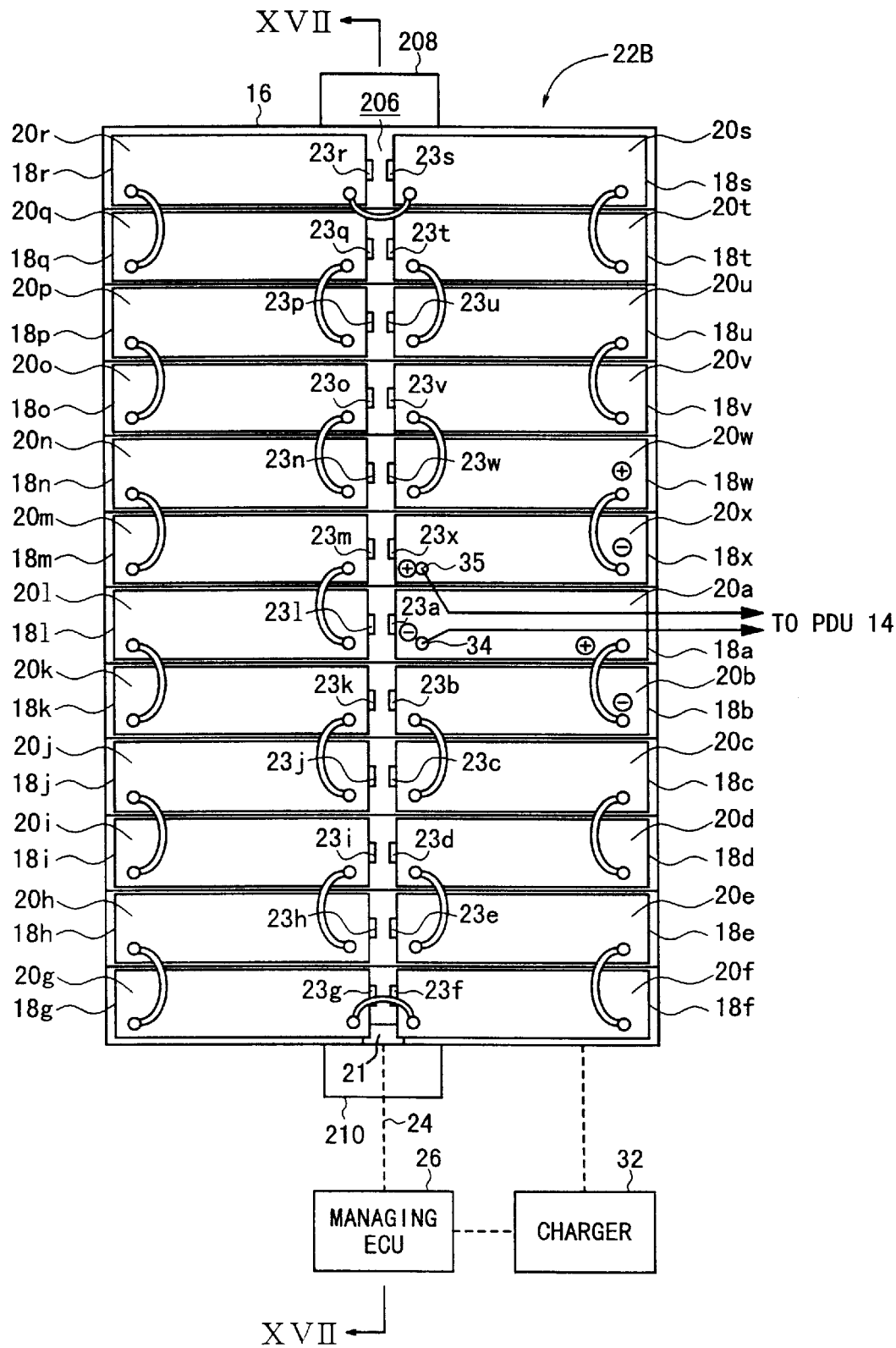
FIG. 16 shows a schematic front view depicting another illustrative arrangement of a transmission and reception unit and a transmission and reception section of a battery condition-detecting unit arranged in a battery box.

FIG. 16 shows an arrangement in which the transmitting/receiving unit 21 and the transmitting/receiving sections 23 of the battery condition-detecting units 20 including the transmitting/receiving sections 23 are disposed in a central passage 206 (space constructed by the opposing walls of the individual batteries 18 and the bottom surface of the battery box 22B) formed at the central portion of the battery box 22B, and an air-introducing fan unit 208 and an air-discharging fan unit 210 are provided at the inlet and the outlet of the central passage 206. In FIG. 16, the cover member for covering the entire front surface of the battery box 22B is omitted from illustration.

Figure 17:
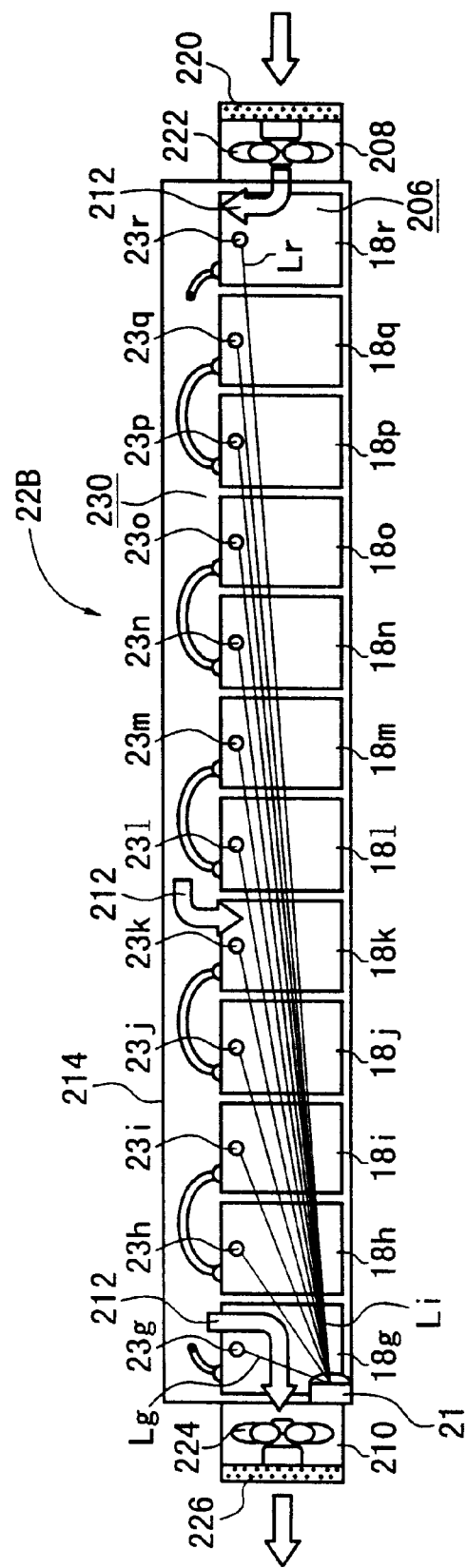
FIG. 17 shows a schematic sectional view taken along a line XVII—XVII shown in FIG. 16.

FIG. 17 shows a cross-sectional arrangement taken along a line XVII—XVII illustrating the battery box 22B shown in FIG. 16, and it also shows the flow of cooling air 212 schematically depicted. As understood from FIG. 17, the battery box 22B includes the transmitting/receiving unit 21 which is arranged in the central passage 206 on the side of the bottom surface (on the lowermost end side) of the battery box 22B on the side of the air-introducing fan unit 210. The respective transmitting/receiving sections 23 are arranged at upper portions of the individual batteries 18. Therefore, it is possible to ensure the linear optical path for the optical signals La to Lx between the transmitting/receiving unit 21 and the respective transmitting/receiving sections 23 of the respective individual batteries 18a to 18x.

With reference to FIG. 17, the cooling air 212 is introduced from the outside into the inside of the battery box 22B via a dust-intercepting filter 220 and a main fan body 222 which constitute the air-introducing fan unit 208. The cooling air 212 is fed along the central passage 206 and an interior space 230 disposed at the inside of the cover member 214. The cooling air 212 is discharged to the outside of the battery box 22B via a main fan body 224 and a dust-intercepting filter 226 which constitute the air-introducing fan unit 210. This arrangement makes it possible to cool, for example, the individual batteries 18, the battery condition-detecting units 20 or the transmitting/receiving sections 23 which are arranged in the battery box 22B.

When the cooling air 212 passes through the central passage 206 arranged with the transmitting/receiving unit 21 and the transmitting/receiving sections 23 of the battery condition-detecting units 20, it is possible to blow the dust which would otherwise adhere to the transmitting/receiving sections 23 and the transmitting/receiving unit 21. Therefore, it is possible to ensure the appropriate optical path for the optical signal.

Figure 18:
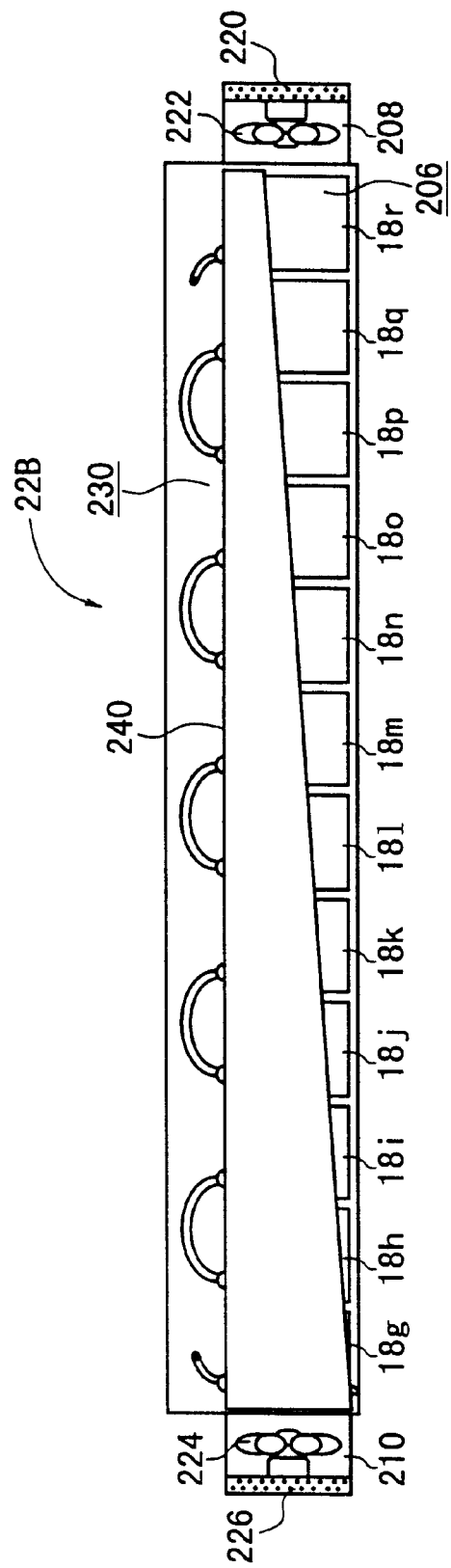
FIG. 18 shows a schematic sectional view illustrating an arrangement comprising a shield plate for an optical path shown in FIG. 17.

As shown in FIG. 18, the battery box 22B exemplarily shown in FIGS. 16 and 17 may be also provided with a substantially trapezoidal shield plate 240 which is disposed over the central passage 206, i.e., over the passage for the cooling air, in order to ensure the optical path between the transmitting/receiving unit 21 and the transmitting/receiving sections 23g to 23r.

In the embodiments described above, the communication between the battery condition-detecting unit 20 and the transmitting/receiving unit 21 is performed by using the optical signal. However, those usable for the communication are not limited to the optical signal. The communication may be also performed by using a wireless radio wave.

According to the embodiments described above, it is possible to obtain a variety of effects as described below.

(1) The information is transmitted by means of the wireless communication such as the optical communication based on the infrared ray between the transmitting/receiving unit 21 and the transmitting/receiving sections 23 of the battery condition-detecting units 20 which are integrally attached corresponding to the respective individual batteries 18. Therefore, it is unnecessary to provide any wiring based on any actual electric wire over the range from the 24 individuals of battery condition-detecting units 20a to 20x to the single transmitting/receiving unit 21. Thus, it is possible to greatly reduce the wiring cost. Further, it is possible to effect the isolation for the circuit at the portion described above. Therefore, it is also possible to reduce the cost which would be otherwise required for the isolation.

(2) The system is arranged such that the drawing line for detecting the voltage of the individual battery 18 is not directly wired from the battery box 22 to the managing ECU 26. Therefore, for example, it is possible to lower the probability of occurrence of disconnection. In this embodiment, it is sufficient for the wiring arrangement from the battery box 22 to the managing ECU 26 to use only the four communication lines (low voltage lines) 24a to 24d. The four communication lines 24a to 24d exist as one electric wire having four cores. As a result, one multi-core electric wire can be used as the wiring bundle (harness) extending from the battery box 22 (or the transmitting/receiving unit 21 thereof) to the managing ECU 26. The multi-core electric wire is not the high voltage line which is thick and hard and which is inconvenient in handling as in the line for detecting the battery condition concerning the conventional technique. Instead, it is enough to use an electric wire for digital signal transmission of 0 V and +5 V. Corresponding thereto, the cost can be reduced, and it is possible to use a slim harness.

(3) The battery condition-detecting unit 20 spontaneously stops after the execution of certain processes after it is started up by the managing ECU 26. Therefore, it is possible to save the electric power. That is, the battery condition-detecting unit 20 is provided with the wake-up function, the self-holding function, and the sleep function. Therefore, it is possible to save the electric power, i.e., lower the electric power consumption.

(4) When the battery set 16 or the individual battery 18 is exchanged, the battery condition-detecting unit 20 can be continuously used as it is for the new battery set 16 or the new individual battery 18 after the exchange. Such a way of use is economic. Therefore, it is possible to reduce the running cost.

(5) The single battery condition-detecting unit 20 can be used to detect the battery condition of every one individual battery 18 or every plurality of individual batteries 18. Therefore, the individual battery 18 can be managed independently from the electric vehicle 10, in other words, irrelevant to the maker and the type of vehicle. Of course, the battery condition-detecting unit 20 can be also utilized for other battery-driven apparatuses other than the electric vehicle 10.

(6) The layout depending on the vehicle, which includes, for example, the computer control program, for example, for the output value of the running motor 12, may be designed for each vehicle, for example, by the automobile manufacturer. On the other hand, the process depending on the battery set 16, which includes, for example, the detection of the deterioration of battery, the detection of the exchange timing of the battery, and the charge management, may be commonly designed irrelevant to the vehicle. Thus, the common feature (versatility) of the circuit concerning the battery part can be improved, making it possible to lower the cost.

(7) The battery condition-detecting units 20 and the transmitting/receiving unit 21 are arranged in the battery box 22 which accommodates the battery set 16. Thus, it is possible to entirely recognize the battery condition of the individual batteries 18 arranged in the battery box 22. Thus, it is possible to obtain the battery box 22 having a high added value in which the internal wiring arrangement is decreased.

(8) The battery condition is transmitted with the delay time difference from the respective battery condition-detecting units 20a to 20x to the transmitting/receiving unit 21. Therefore, it is possible to make the transmission and reception protocol extremely simple and convenient.

As explained above, according to the present invention, the battery condition-detecting unit connected to the individual battery is arranged at the position separated from the receiving unit for receiving the battery condition detected by the battery condition-detecting unit. The battery condition detected by the battery condition-detecting unit is transmitted to the receiving unit by using the optical signal. Therefore, it is unnecessary to provide the harness as the wiring arrangement between the battery condition-detecting unit and the receiving unit. Thus, the system is simple, and it is possible to reduce the cost. For example, the infrared ON/OFF signal can be used as the optical signal.

In the present invention, the battery condition-detecting unit and the receiving unit are arranged in the battery box which accommodates the battery set. Accordingly, the transmitting section for the optical signal disposed on the side of the battery condition-detecting unit and the receiving section for the optical signal disposed on the side of the receiving be fixedly arranged.

The receiving unit is allowed to have the transmitting function for the start-up signal. The optical signal (start-up signal described above) for representing the start-up is transmitted from the receiving unit to start up the respective battery condition-detecting units so that the battery condition is detected. The detected battery condition is transmitted to the receiving unit after each of the prescribed periods of time set as the different periods of time for each of the battery condition-detecting units. Accordingly, the information on the battery condition can be sent by means of the serial communication in accordance with the time shearing process. Further, it is possible to save the electric power for the battery condition-detecting unit. The prescribed transmission time differs depending on the respective battery condition-detecting units. Therefore, the battery condition-detecting unit, which has transmitted the information on the specified battery, can be specified by the receiving unit by utilizing the difference in prescribed transmission time.

The battery condition-detecting unit according to the present invention is operated for the predetermined period of time by receiving the battery condition detection command from the transmitting/receiving unit to detect the condition of one individual battery or a plurality of individual batteries corresponding thereto. The detected battery condition is transmitted to the transmitting/receiving unit after each of the prescribed transmission periods of time set to be different for each of the battery condition-detecting units. The operation is automatically stopped after the transmission of the battery condition to give the start-up-waiting state. The battery condition-detecting units itself outputs the optical signal. Therefore, it is possible to miniaturize the size, obtain a slim harness, reduce the cost, and lower the electric power consumption.

It is a matter of course that the present invention is not limited to the embodiments described above, which may be embodied in other various forms without deviating from the gist or essential characteristics of the present invention.

What is claimed is:

1. A battery condition-detecting apparatus comprising:
   a battery set including a plurality of individual batteries connected in series;
   a battery condition-detecting unit for each battery of said plurality of individual batteries, each of said battery condition-detecting unit detects a battery condition of said corresponding battery and includes a transmitting and receiving section; and a receiving unit that receives the battery condition detected by each of said battery condition-detecting unit and transmitted to said receiving unit by said transmitting and receiving section of said corresponding battery condition-detecting unit, wherein:

each of said battery condition-detecting unit is arranged at a position separate from said receiving unit; and said battery condition detected by said battery condition-detecting condition detecting unit is transmitted by said transmitting and receiving section to said receiving unit by an optical signal.

2. The battery condition-detecting apparatus according to claim 1, wherein said battery condition-detecting unit and said receiving unit are arranged in a battery box for accommodating said battery set.

3. The battery condition-detecting apparatus according to claim 1, wherein:

said receiving unit includes a function for transmitting a start-up signal; and said battery condition-detecting unit is started up by receiving said start-up signal based on said optical signal transmitted from said receiving unit to start said detection of said battery condition, and said detected battery condition is transmitted to said receiving unit after each of periods of prescribed transmission time which are set as different periods of time for said respective battery condition-detecting units.

4. The battery condition-detecting apparatus according to claim 2, wherein:

said receiving unit includes a function for transmitting a start-up signal; and said battery condition-detecting unit is started up by receiving said start-up signal based on said optical signal transmitted from said receiving unit to start said detection of said battery condition, and said detected battery condition is transmitted to said receiving unit after each of periods of prescribed transmission time which are set as different periods of time for said respective battery condition-detecting units.

5. The battery condition-detecting apparatus according to claim 1, further comprising a shield plate for shielding an optical path for said optical signal between said battery condition-detecting unit and said receiving unit, from external inhibiting factors for said optical path.

6. The battery condition-detecting apparatus according to claim 2, further comprising a shield plate for shielding an optical path for said optical signal between said battery condition-detecting unit and said receiving unit, from external inhibiting factors for said optical path.

7. The battery condition-detecting apparatus according to claim 3, further comprising a shield plate for shielding an optical path for said optical signal between said battery condition-detecting unit and said receiving unit, from external inhibiting factors for said optical path.

8. The battery condition-detecting apparatus according to claim 4, further comprising a shield plate for shielding an optical path for said optical signal between said battery condition-detecting unit and said receiving unit, from external inhibiting factors for said optical path.

9. The battery condition-detecting apparatus according to claim 5, further comprising:

a cooling air-feeding unit for feeding cooling air into said battery box, wherein:

said shield plate is arranged over a cooling air passage formed in said battery box.

10. The battery condition-detecting apparatus according to claim 6, further comprising:

a cooling air-feeding unit for feeding cooling air into said battery box, wherein:

said shield plate is arranged over a cooling air passage formed in said battery box.

11. The battery condition-detecting apparatus according to claim 7, further comprising:

a cooling air-feeding unit for feeding cooling air into said battery box, wherein:

said shield plate is arranged over a cooling air passage formed in said battery box.

12. The battery condition-detecting apparatus according to claim 8, further comprising:

a cooling air-feeding unit for feeding cooling air into said battery box, wherein:

said shield plate is arranged over a cooling air passage formed in said battery box.

13. A battery condition-detecting unit for constructing a battery set including a plurality of individual batteries connected in series, said battery condition-detecting unit detects a battery condition of each battery of said individual batteries in said constructed battery set, wherein:

each of said battery condition-detecting unit includes a transmitting and receiving section that communicates with a transmitting/receiving unit by an optical signal, and:

each of said battery condition-detecting unit is started up for a predetermined period of time by receiving a battery condition detection command from said transmitting/receiving unit to detect the battery condition of said corresponding one individual battery, said detected battery condition is transmitted to said transmitting/receiving unit after each period of prescribed transmission time which are set as different periods of time for said respective battery condition-detecting units, and said battery condition-detecting unit automatically stops operation after said transmission of said battery condition to be in a start-up-waiting state.

* * * * *